(12) United States Patent
Fukatsu

(10) Patent No.: US 7,146,547 B2
(45) Date of Patent: Dec. 5, 2006

(54) SEMICONDUCTOR DEVICE

(75) Inventor: Gen Fukatsu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 433 days.

(21) Appl. No.: 10/731,466

(22) Filed: Dec. 10, 2003

(65) Prior Publication Data

US 2004/0120181 A1  Jun. 24, 2004

(30) Foreign Application Priority Data

Dec. 24, 2002   (JP)  ............................ P2002-372146

(51) Int. Cl.
*G11C 29/00* (2006.01)

(52) U.S. Cl. ................. 714/718; 714/733; 365/201

(58) Field of Classification Search ............... None
See application file for complete search history.

(56) References Cited

U.S. PATENT DOCUMENTS

| | | | | |
|---|---|---|---|---|
| 5,729,553 A | * | 3/1998 | Motohara | 714/733 |
| 5,960,008 A | * | 9/1999 | Osawa et al. | 714/726 |
| 5,961,653 A | * | 10/1999 | Kalter et al. | 714/7 |
| 6,829,728 B1 | * | 12/2004 | Cheng et al. | 714/30 |

* cited by examiner

*Primary Examiner*—Guy LaMarre
*Assistant Examiner*—John P. Trimmings
(74) *Attorney, Agent, or Firm*—McDermott Will & Emery LLP

(57) ABSTRACT

In a testing method for a semiconductor memory using a memory BIST process, when it is difficult to carry out a comparing process in one cycle, a pipelining process is used for an expected value comparison, and in this case, in order to cut the number of flip-flops and to reduce an occupied area, at the time of a memory BIST process, a pipeline-use flip-flop and a scan-observing-use flip-flop and/or a scan-control-use flip-flop are used.

8 Claims, 19 Drawing Sheets

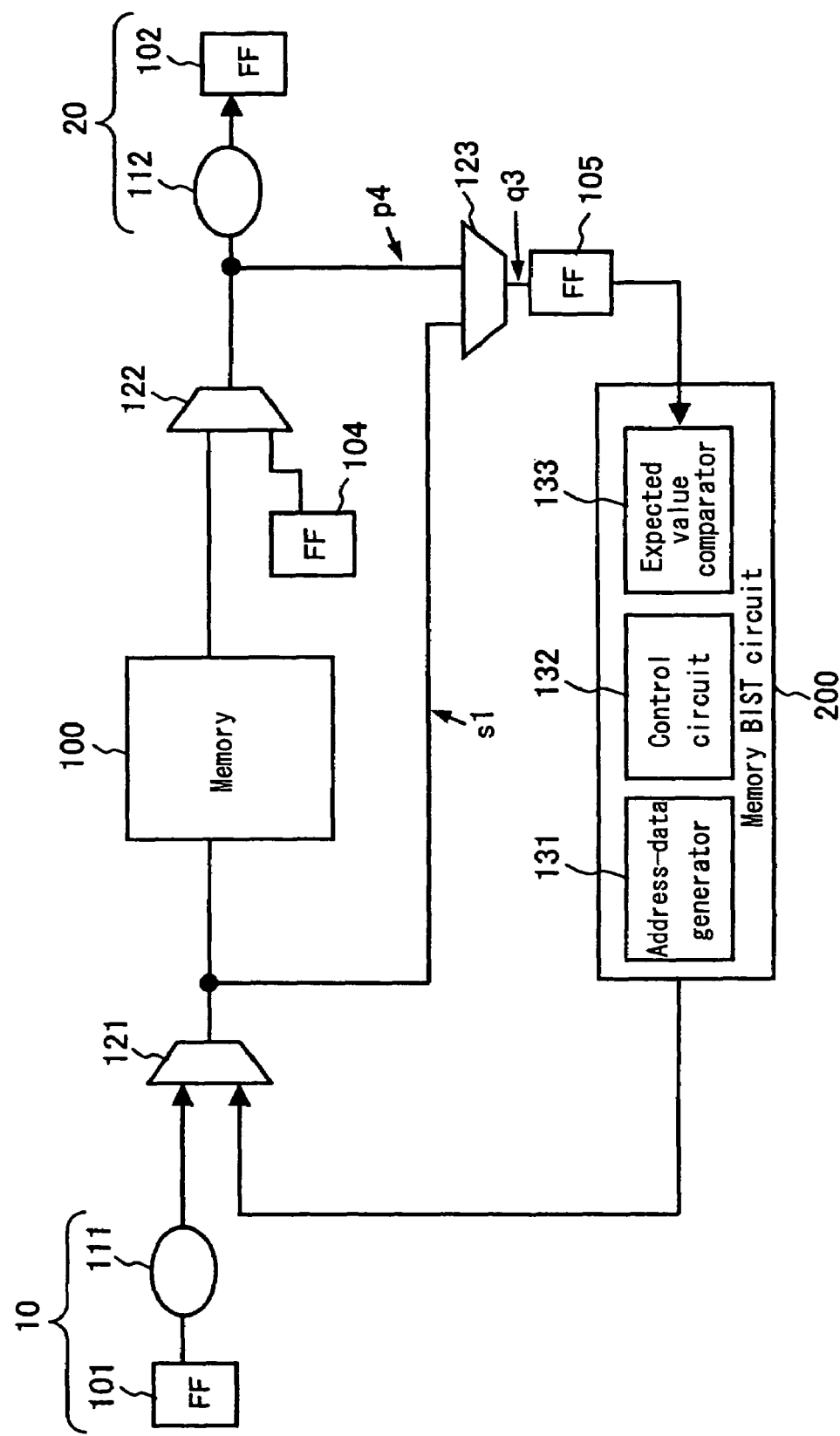
F I G. 5

F I G. 12
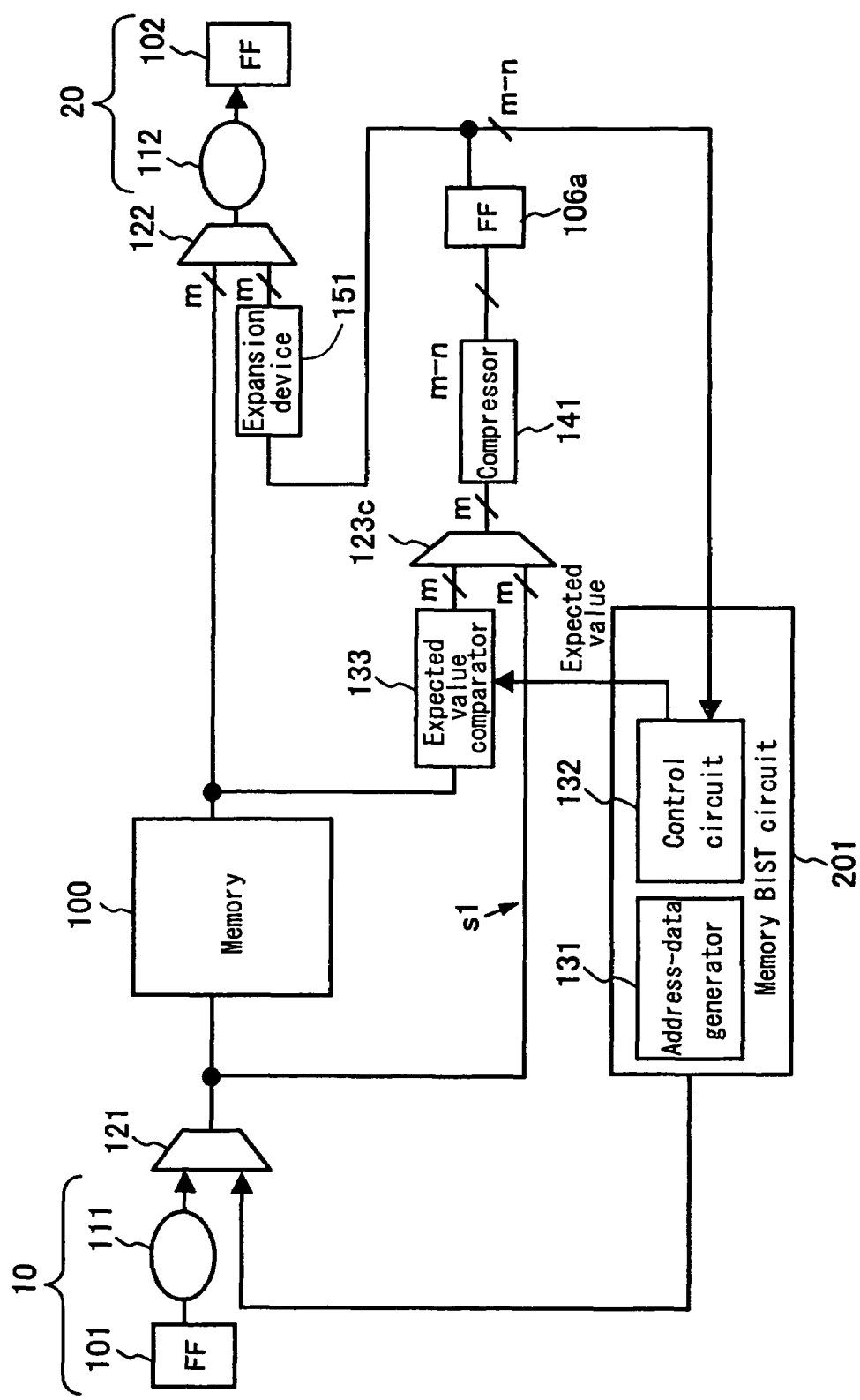

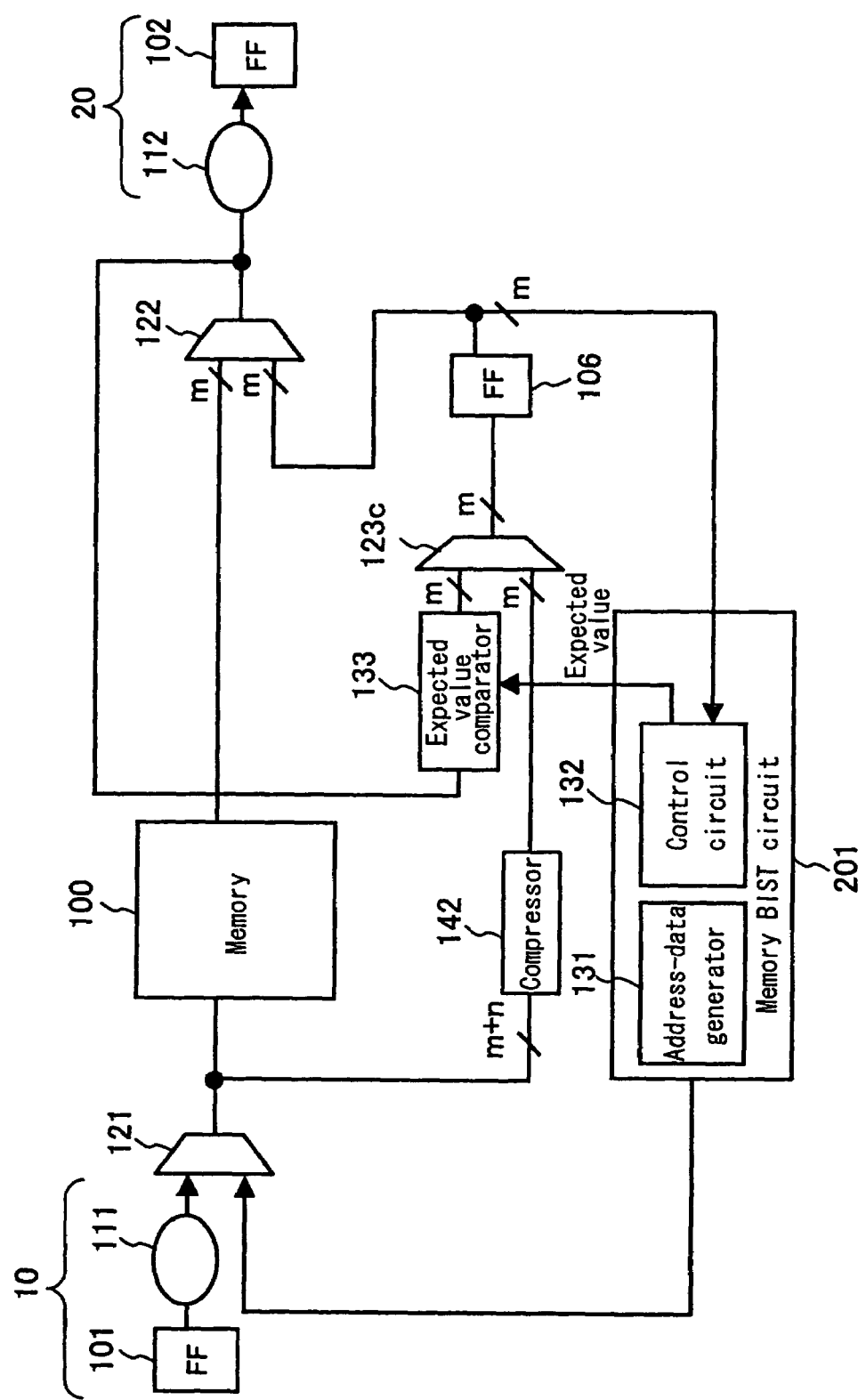
F I G. 15

SEMICONDUCTOR DEVICE

BACKGROUND OF THE INVENTION

The present invention relates to a semiconductor device that tests memories. A BIST (Built-in Self Test) is a technique which makes it easier to carry out tests on a semiconductor device by allowing the semiconductor device to test itself. A memory BIST circuit, used for testing a memory, comprises address data generator, a control circuit and an expected value comparator. Upon normal operation, data is inputted to the memory from a combination circuit on the input side, and the data, outputted from the memory, is directed to a combination circuit on the output side. At the time of a memory BIST process, the memory BIST circuit is activated and access is made to the memory by using an address-data generator so that data, outputted from the memory, is inputted to the expected value comparator. At the time of a scanning test, a scanning-use test pattern, outputted from a control-use flip-flop, is supplied to the combination circuit on the output side. Moreover, the scanning-use test pattern is used to control a selection circuit so that the combination circuit and the memory BIST circuit on the input side are switched, and connected to an observing-use flip-flop; thus, failures in the respective circuits are observed.

In the memory BIST process, the memory is generally tested by using an operational frequency. In recent years, the operational frequency becomes higher in response to higher performances of the semiconductor, and it becomes difficult to carry out expected value comparison of the output data of the memory in one cycle. For this reason, in order to achieve high-speed operations, a method in which the expected value comparing process, carried out based upon output data from the memory, is finely divided so that the respective processes are carried out in parallel with each other, (i.e. pipeline method) tends to be used.

In the pipeline system, a flip-flop is added, which forms a path from a memory to the memory BIST circuit into pipelines. However, in the case of many memories, or in the case of a great number of output bits, the number of pipeline-use flip-flops increases, resulting in an extreme increase in required area.

SUMMARY OF THE INVENTION

Therefore, a main objective of the present invention is to reduce an increase in required area by reducing the number of flip-flops.

These and other objects, features and advantages of the present invention will become apparent upon consideration of the following detailed description of the invention.

In order to solve the above-mentioned problems, the present invention offers the following solutions.

In accordance with a first solution of the present invention, a semiconductor device is provided with the following arrangement. The arrangement is provided with a plurality of constituent elements having functions described below, such as a memory, a normal operation path on an input side, a normal operation path on an output side, a memory BIST circuit, an observing-use flip-flop, a control-use flip-flop, a first selection circuit and a second selection circuit. The normal operation path on the input side is formed by the flip-flop on the input side and a combination circuit on the input side with respect to the memory. The normal operation path on the output side is formed by a combination circuit on the output side and a flip-flop on the output side with respect to the memory. The memory BIST circuit is used for testing the above-mentioned memory. The above-mentioned first selection circuit selects either the above-mentioned normal operation path on the input side or the input path from the above-mentioned memory BIST circuit, and connects this to the input of the memory. The above-mentioned observing-use flip-flop is connected to the output of the first selection circuit. At the time of a scanning test, the control-use flip-flop supplies a scanning-use test pattern to the normal operation path on the output side. The above-mentioned second selection circuit selects either the output of the above-mentioned memory or the output of the control-use flip-flop, and connects this to the normal operation path and the input of the memory BIST circuit on the output side. In the semiconductor device having the above-mentioned arrangement, the above-mentioned control-use flip-flop is designed to form a control/pipeline shared-use flip-flop, with the output of the memory being connected to its input so as to be shared as a pipeline-use flip-flop (see, FIG. 1).

The semiconductor device in accordance with the second solution of the present invention, which relates to the arrangement of the first solution, is designed so that, in place of the connection of the output of the second selection circuit to the input of the above-mentioned memory BIST circuit, the output of the control/pipeline shared-use flip-flop having the shared arrangement is connected to the input of the memory BIST circuit (see FIG. 2).

The semiconductor device in accordance with the third solution of the present invention, which relates to the arrangement of the first solution, is designed so that, in place of the connection of the output of the above-mentioned memory to the input of the control/pipeline shared-use flip-flop having the shared arrangement, the output of the second selection circuit is connected to the input of the control/pipeline shared-use flip-flop having the shared arrangement, while, in place of the connection of the output of the second selection circuit to the input of the above-mentioned memory BIST circuit, the output of the control/pipeline shared-use flip-flop having the shared arrangement is connected to the input of the above-mentioned memory BIST circuit (see, FIG. 3).

With the above-mentioned arrangement, one flip-flop is utilized as a control-use flip-flop for supplying a scanning-use test pattern at the time of a scanning test and as a pipeline-use flip-flop used at the time of a memory BIST process. Consequently, in comparison with a case in which the two flip-flops having these two functions are installed independently, the number of the flip-flops can be reduced by half, making it possible to reduce the required area for the device.

In accordance with a fourth solution of the present invention, a semiconductor device has the following arrangement. The arrangement is provided with a plurality of constituent elements having functions described below, such as a memory, a normal operation path on an input side, a normal operation path on an output side, a memory BIST circuit, an observing/pipeline shared-use flip-flop, a control-use flip-flop, a first selection circuit, a second selection circuit and a third selection circuit. The normal operation path on the input side is formed by the flip-flop on the input side and a combination circuit on the input side with respect to the memory. The normal operation path on the output side is formed by a combination circuit on the output side and a flip-flop on the output side with respect to the memory. The memory BIST circuit is used for testing the above-mentioned memory. The above-mentioned first selection circuit selects either the above-mentioned normal operation path on the input side or the input path from the above-mentioned memory BIST circuit, and connects this to the input of the memory. At the time of a scanning test, the control-use flip-flop supplies a scanning-use test pattern to the normal operation path on the output side. The above-mentioned second selection circuit selects either the output of the above-mentioned memory or the output of the control-use flip-flop, and connects this to the input of the normal operation path on the output side. The above-mentioned third selection circuit selects either the output of the first selection circuit or the output of the above-mentioned memory. The above-mentioned observing/pipeline shared-use flip-flop to which the output of the above-mentioned third selection circuit is inputted is further connected to the input of the above-mentioned memory BIST circuit (see, FIG. 4). This arrangement is characterized in that the observing-use flip-flop with respect to the normal operation path and the memory BIST circuit on the input side and the pipe-line-use flip-flop for use in the memory BIST process are unified.

The semiconductor device in accordance with a fifth solution of the present invention, which relates to the arrangement of the fourth solution, is designed so that, in place of the connection of the output of the above-mentioned memory to the input of the third selection circuit, the output of the above-mentioned second selection circuit is connected to the input of the above-mentioned third selection circuit (see FIG. 5).

With the above-mentioned arrangement, one flip-flop is utilized as the observing-use flip-flop and the pipeline-use flip-flop. Consequently, in comparison with a case in which the two flip-flops having these two functions are installed independently, the number of the flip-flops can be reduced by half, making it possible to reduce the area required for the device. Moreover, the control-use flip-flop is exclusively used for scanning tests so that in the case of a complex combination circuit on the output side, the number of test patterns can be reduced by the exclusive controlling operation.

In accordance with a sixth solution of the present invention, a semiconductor device has the following arrangement. The arrangement is provided with a plurality of constituent elements having functions described below, such as a memory, a normal operation path on an input side, a normal operation path on an output side, a memory BIST circuit, a control-use flip-flop, a first selection circuit, a second selection circuit and a third selection circuit. The normal operation path on the input side is formed by the flip-flop on the input side and a combination circuit on the input side with respect to the memory. The normal operation path on the output side is formed by a combination circuit on the output side and a flip-flop on the output side with respect to the memory. The memory BIST circuit is used for testing the above-mentioned memory. The above-mentioned first selection circuit selects either the above-mentioned normal operation path on the input side or the input path from the above-mentioned memory BIST circuit, and connects this to the input of the memory. At the time of a scanning test, the control-use flip-flop supplies a scanning-use test pattern to the normal operation path on the output side. The above-mentioned second selection circuit selects either the output of the above-mentioned memory or the output of the control-use flip-flop, and connects this to the normal operation path on the output side and the input of the above-mentioned memory BIST circuit. The above-mentioned third selection circuit selects either the output of the first selection circuit or the output of the above-mentioned memory. In the semiconductor device having the above-mentioned arrangement, the output of the above-mentioned third selection circuit is further connected to the input of the above-mentioned control-use flip-flop so that the above-mentioned control-use flip-flop is formed into a control/observing/pipeline shared-use flip-flop that is shared as an observing-use flip-flop and a pipeline-use flip-flop (see, FIG. 6). This arrangement is characterized in that the observing-use flip-flop with respect to the normal operation path on the input side and the memory BIST circuit, the pipeline-use flip-flop for use in the memory BIST process and the control-use flip-flop for use in the scanning test are unified.

The semiconductor device in accordance with a seventh solution of the present invention, which relates to the arrangement of the sixth solution, is designed so that, in place of the connection of the output of the above-mentioned memory to the input of the third selection circuit, the output of the above-mentioned second selection circuit is connected to the input of the above-mentioned third selection circuit, while, in place of the connection of the output of the second selection circuit to the input of the above-mentioned memory BIST circuit, the output of the control/observing/pipeline shared-use flip-flop having the shared arrangement is connected to the input of the above-mentioned memory BIST circuit (see FIG. 7).

With the above-mentioned arrangement, one flip-flop is shared as the observing-use flip-flop, the pipeline-use flip-flop and the control-use flip-flop. Consequently, in comparison with a case in which the three flip-flops having these three functions are installed independently, the number of the flip-flops can be reduced to one-third, making it possible to further reduce the area required for the device. Moreover, at the time of a scanning test, the control/observing/pipeline shared-use flip-flop is exclusively used for the scanning test. Therefore, in the case of a complex combination circuit on the output side, the number of test patterns can be reduced by the exclusive controlling operation.

The semiconductor device in accordance with the above-mentioned invention can be modified as follows:

With respect to the above-mentioned first to third solutions, an expected value comparator of the above-mentioned memory BIST circuit is taken out from the inside of the memory BIST circuit, and inserted into the following portions. In other words, the above-mentioned expected value comparator is inserted between the output of the above-mentioned memory and the input of the above-mentioned flip-flop that is shared (see, p1 in FIG. 1 and FIG. 2). Alternatively, the above-mentioned expected value comparator is inserted between the output of the above-mentioned second selection circuit and the input of the above-mentioned flip-flop that has been shared (see, p2 in FIG. 3). Alternatively, the above-mentioned expected value comparator is inserted between the output of the above-mentioned memory and the input of the above-mentioned third selection circuit (see, p3 in FIG. 4). Alternatively, the above-mentioned expected value comparator is inserted between the output of the above-mentioned second selection circuit and the input of the above-mentioned third selection circuit (see, p4 in FIG. 5 and FIG. 7). Alternatively, the above-mentioned expected value comparator is inserted between the output of the above-mentioned memory and the input of the above-mentioned third selection circuit (see, p5 in FIG. 6)(see, FIG. 8 and FIG. 9).

In accordance with the above-mentioned arrangements, prior to pipelining by the use of the shared flip-flop at the time of a memory BIST process, an expected value comparing process is carried out by the expected value comparator placed on the preceding stage. As a result, in the path from the shared flip-flop to the control circuit inside the memory BIST circuit, a timing margin corresponding to a delay that the expected value comparator has is prepared so that a testing operation can be carried out by using an actual operation frequency even in the case of a memory BIST circuit having a great delay.

Moreover, the semiconductor device can be modified as follows.

More specifically, in the semiconductor device provided with the above-mentioned expected value comparator, a compressor is installed in the path from the output of the above-mentioned expected value comparator to the input of the above-mentioned shared flip-flop (see, FIG. 10 and FIG. 11 as well as q1 to q3 in FIGS. 1 to 9). Data, which has been outputted from the memory and has passed through the expected value comparator at the time of a memory BIST process, is allowed to pass through the compressor so that the number of bits thereof is reduced. Consequently, it is possible to reduce the number of shared flip-flops.

Furthermore, the semiconductor device can also be modified as follows.

Specifically, in the semiconductor device provided with the above-mentioned expected value comparator and compressor, an expansion device is installed between the output of the above-mentioned shared flip-flop and the input of the second selection circuit (see, FIG. 12 and FIG. 13, see, r1 in FIGS. 6 to 9). In accordance with this arrangement, the control-use flip-flop, exclusively used for the scanning test, can be omitted so that the control-use flip-flop is unified into a shared flip-flop. In other words, one flip-flop can be utilized as a flip-flop having three functions of an observing-use flip-flop, a pipeline-use flip-flop and a control-use flip-flop, making it possible to greatly reduce the number of flip-flops, and consequently to cut the area required for the device. Here, the expansion device needs to be placed on the succeeding stage of the shared flip-flop since the corresponding circuit needs to pass through the expected value comparator and the compressor.

The semiconductor device can be further modified as follows.

Specifically, in the semiconductor device provided with the above-mentioned third selection circuit, a compressor is installed between the output of the first selection circuit and the above-mentioned third selection circuit (see FIG. 14 and FIG. 15 as well as s1 of FIGS. 4 to 13). The number of input pins in the memory is greater than the number of output pins thereof in association with addresses and the like. By applying the compressor to the output of the first selection circuit that is connected to the input pins of the memory, the number of the input pins is reduced to the number of the output pins, thereby making it possible to reduce the number of the shared flip-flops.

The semiconductor device can still be further modified as follows.

Specifically, in any one of the above-mentioned semiconductor devices, the input path of expected value data to the above-mentioned expected value comparator is utilized a data-input path to the above-mentioned memory that extends from the above-mentioned memory BIST circuit thereto through the above-mentioned first selection circuit (see, FIG. 16 and FIG. 17). In the case of a normal memory, since reading and writing operations are not carried out simultaneously, the data input at the time of a reading operation can be utilized as an expected value. In this case, the output value of the memory to be inputted to the expected value comparator is set to a calculable value that is used for forming an expected value data or a fixed value. With this arrangement, it becomes possible to omit the third selection circuit.

The semiconductor device can still be further modified as follows.

Specifically, in any one of the above-mentioned semiconductor devices, the output of the above-mentioned memory is connected to the input of the above-mentioned expected value comparator, with the output of the above-mentioned expected value comparator being connected to the input of the normal operation path on the output side (see, FIG. 18). In this case also, it is possible to omit the third selection circuit.

The foregoing and other solutions will become apparent from the following description of the invention when considered in conjunction with the accompanying drawing figures.

BRIEF DESCRIPTION OF THE DRAWING FIGURES

FIG. 5 is a block diagram that shows a structure of a semiconductor device in accordance with embodiment 5 of the present invention;

FIG. 12 is a block diagram that shows a structure of a semiconductor device in accordance with embodiment 10 of the present invention;

FIG. 15 is a block diagram that shows a structure of a semiconductor device in a modified mode of embodiment 11 of the present invention;

In all these figures, like components are indicated by the same numerals.

DETAILED DESCRIPTION (Additional Explanation)

Figure 19:
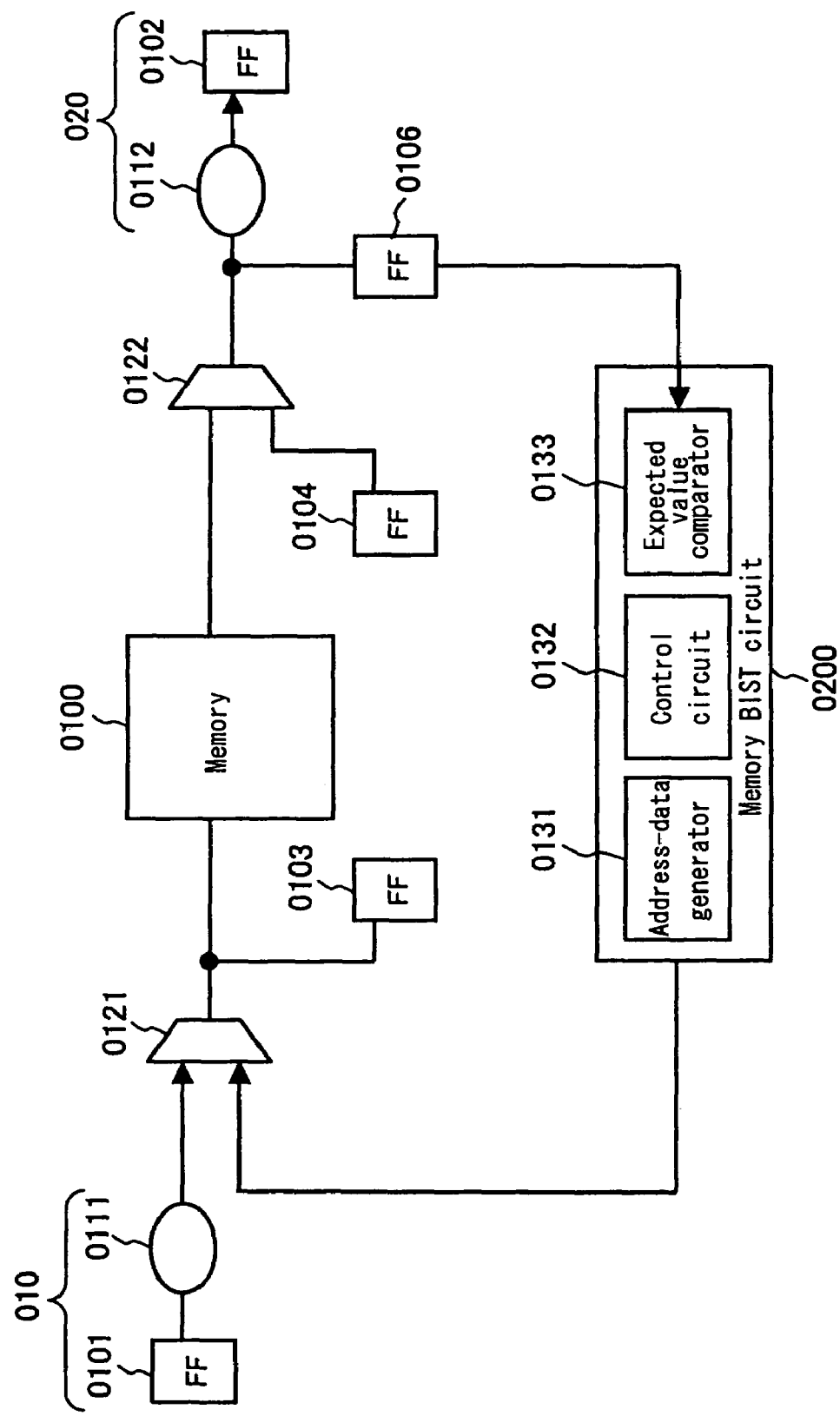
FIG. 19 is a drawing that shows a semiconductor device as a comparative example.

For better understanding, prior to explaining a semiconductor device in accordance with embodiments of the present invention, the following description discusses a comparative example that forms the basis of the embodiments by reference to FIG. 19.

FIG. 19 shows a semiconductor device of a comparative example in which a pipeline system is used. Reference numeral 0100 represents a memory, 0200 is a memory BIST circuit, 0101 is a flip-flop on an input side, 0102 is a flip-flop on an output side, 0103 is an observing-use flip-flop, 0104 is a control-use flip-flop, 0106 is a pipeline-use flip-flop, 0111 is a combination circuit on the input side, 0112 is a combination circuit on the output side, 0121 is a first selection circuit and 0122 is a second selection circuit.

The functions of the respective constituent elements in the semiconductor device of this comparative example are explained as follows. The flip-flop 0101 and the combination circuit 0111 on the input side form a normal operation path 010 on the input side that has the memory 0100 as its terminal at the time of a normal operation. The combination circuit 0112 and the flip-flop 0102 on the output side forms a normal operation path 020 on the output side that has the memory 0100 as its starting point at the time of a normal operation. The memory BIST circuit 0200, which is used for testing the memory 0100, include an address-data generator 0131, a control circuit 0132 and an expected value comparator 0133. The first selection circuit 0121 selects the normal operation path 010 on the input side at the time of a normal operation, while it selects a path from the memory BIST circuit 0200 at the time of a memory BIST process. The second selection circuit 0122 selects a path from the memory 0100, and connects this to the normal operation path 020 on the output side at the time of a normal operation, while it selects a path from the control-use flip-flop 0104 at the time of a scanning test. The observing-use flip-flop 0103 observes the normal operation path 010 on the input side at the time of the scanning test. The control-use flip-flop 0104 supplies a scanning pattern to the normal operation path 020 on the output side at the time of the scanning test. The pipeline-use flip-flop 0106 forms the path from the memory 0100 to the memory BIST circuit 0200 into a pipeline.

With respect to the semiconductor device of the comparative example having the above-mentioned arrangement, the following description discusses the operation thereof.

First, at the time of the normal operation, the first selection circuit 0121 selects the normal operation path 010 on the input side that has the flip-flop 0101 on the input side as its starting point, while the second selection circuit 0122 selects the output of the memory 0100, so that these are connected to the normal operation path 020 on the output side having the flip-flop 0102 on the output side as its terminal point.

Moreover, at the time of the BIST process, the first selection circuit 0121 selects a path from the memory BIST circuit 0200, while the second selection circuit 0122 selects the memory 0100, and after subjecting the memory output data to a pipelining process by the pipeline-use flip-flop 0106, the resulting data is sent to the expected value comparator 0133 of the memory BIST circuit 0200.

Furthermore, at the time of the scanning test, the second selection circuit 0122 selects the output of the control-use flip-flop 0104 so that a scanning-use test pattern is supplied to the combination circuit 0112 on the output side of the normal operation path 020 on the output side having the flip-flop 0102 on the output side as its terminal. Moreover, by controlling the control input of the first selection circuit 0121 using the scanning-use test pattern, failures in the combination circuit 0111 and the memory BIST circuit 0200 on the input side are observed by the observing-use flip-flop 0103.

However, in the case when there are a great number of memories or when there are a great number of output bits, an increased number of flip-flops 0106 for use in a pipelining process in the memory BIST are required, resulting in an increase in the required area for the device.

In order to solve these problems seen in this comparative example and also to reduce the required number of flip-flops to prevent an increase in the required area, the following embodiments of the present invention have been devised.

EMBODIMENTS OF THE PRESENT INVENTION

Referring to Figures, the following description discusses preferable embodiments of a semiconductor device in accordance with the present invention.

Embodiment 1

Embodiment 1 of the present invention, which relates to the comparative example shown in FIG. 19, corresponds to the arrangement thereof from which the pipeline-use flip-flop 0106 is omitted with its functions being incorporated into the control-use flip-flop 0104.

Figure 1:
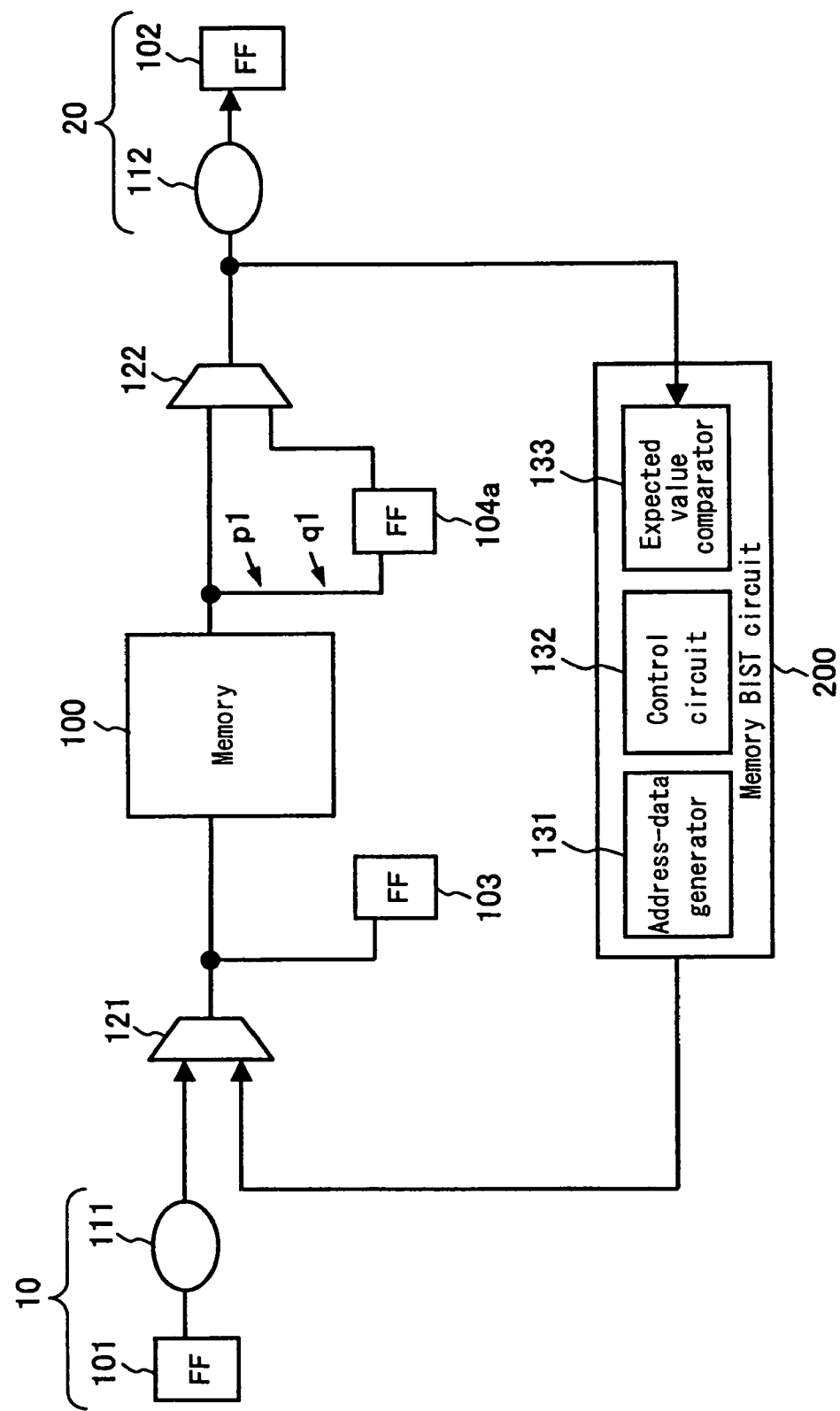
FIG. 1 is a block diagram that shows a structure of a semiconductor device in accordance with embodiment 1 of the present invention.

FIG. 1 shows the structure of a semiconductor device in accordance with embodiment 1 of the present invention. As shown in FIG. 1, the semiconductor device of the present embodiment is provided with: a memory 100, a normal operation path 10 on an input side, formed by a flip-flop 101 and a combination circuit 111 on an input side with respect to the memory 100, a normal operation path 20 on an output side, formed by a combination circuit 112 and a flip-flop 102 on an output side with respect to the memory 100, a memory BIST circuit 200 with respect to the memory 100, a first selection circuit 121 which selects either the normal operation path 10 on the input side or an input path from the memory BIST circuit 200, and connects this to the input of the memory 100, an observing-use flip-flop 103 connected to the output of the first selection circuit 121, a control-use flip-flop 104a which supplies a scanning-use test pattern to the normal operation path 20 on the output side at the time of a scanning test, and a second selection circuit 122 which selects either the output of the memory 100 or the output of the control-use flip-flop 104a, and connects this to the normal operation path 20 on the output side and the input of the memory BIST circuit 200. Further, the control-use flip-flop 104a is designed so that the output of the memory 100 is connected to its input to form a control/pipeline shared use flip-flop that is utilized as the pipeline-use flip-flop.

The flip-flop 101 and the combination circuit 111 on the input side form the normal operation path 10 on the input side, having the memory 100 as its terminal. Moreover, the flip-flop 102 and the combination circuit 112 on the output side form the normal operation path 20 on the output side, having the memory 100 as its starting point. The memory BIST circuit 200, which is used for testing the memory 100, is provided with an address-data generator 131, a control circuit 132 and an expected value comparator 133. The first selection circuit 121 selects the normal operation path 10 on the input side at the time of a normal operation, while it selects the path from the memory BIST circuit 200 at the time of a memory BIST process. Moreover, the second selection circuit 122 selects the path from the memory 100 at the time of the normal operation, while it selects the path from the control/pipeline shared-use flip-flop 104a at the time of a scanning test. The observing-use flip-flop 103 observes the normal operation path 10 on the input side at the time of the scanning test. The control/pipeline shard flip-flop 104a, which is connected to the output side of the memory 100, controls the normal operation path 20 on the output side at the time of the scanning test, while it subjects data for expected value comparison to a pipelining process at the time of the memory BIST process.

With respect to the semiconductor device of the present embodiment having the above-mentioned arrangement, the following description discusses the operation thereof.

First, at the time of a normal operation, the first selection circuit 121 selects the normal operation path 10 on the input side, having the flip-flop 101 on the input side as its starting point, and the second selection circuit 122 selects the output of the memory 100, and connects this to the normal operation path 20 on the output side, having the flip-flop 102 on the output side as its terminal.

Further, at the time of a memory BIST process, the first selection circuit 121 selects the path from the memory BIST circuit 200, and data, outputted from the memory 100, is selected by the second selection circuit 122 after having been subjected to the pipelining process by the control/pipeline shared-use flip-flop 104a, and sent to the memory BIST circuit 200.

At the time of the scanning test, the second selection circuit 122 selects the output of the control/pipeline shared use flip-flop 104a, and supplies a scanning-use test pattern to the combination circuit 112 and the memory BIST circuit 200 on the output side of the normal operation path 20 on the output side, having the flip-flop 102 on the output side as its terminal. Moreover, by controlling the control input of the first selection circuit 121 using the scanning-use test pattern, the observing-use flip-flop 103 is allowed to observe failures in the combination circuit 111 and the memory BIST circuit 200 on the input side.

As described above, in accordance with the present embodiment, the flip-flop 104a is formed into a control/pipeline shared-use flip-flop to which a pipeline-use flip-flop for use in a memory BIST process and a control-use flip-flop for use in a scanning test are both incorporated. Consequently, in comparison with a case in which the two flip-flops having these two functions are installed independently, the number of the flip-flops can be reduced by half, making it possible to reduce the area required for the device.

Embodiment 2

Figure 2:
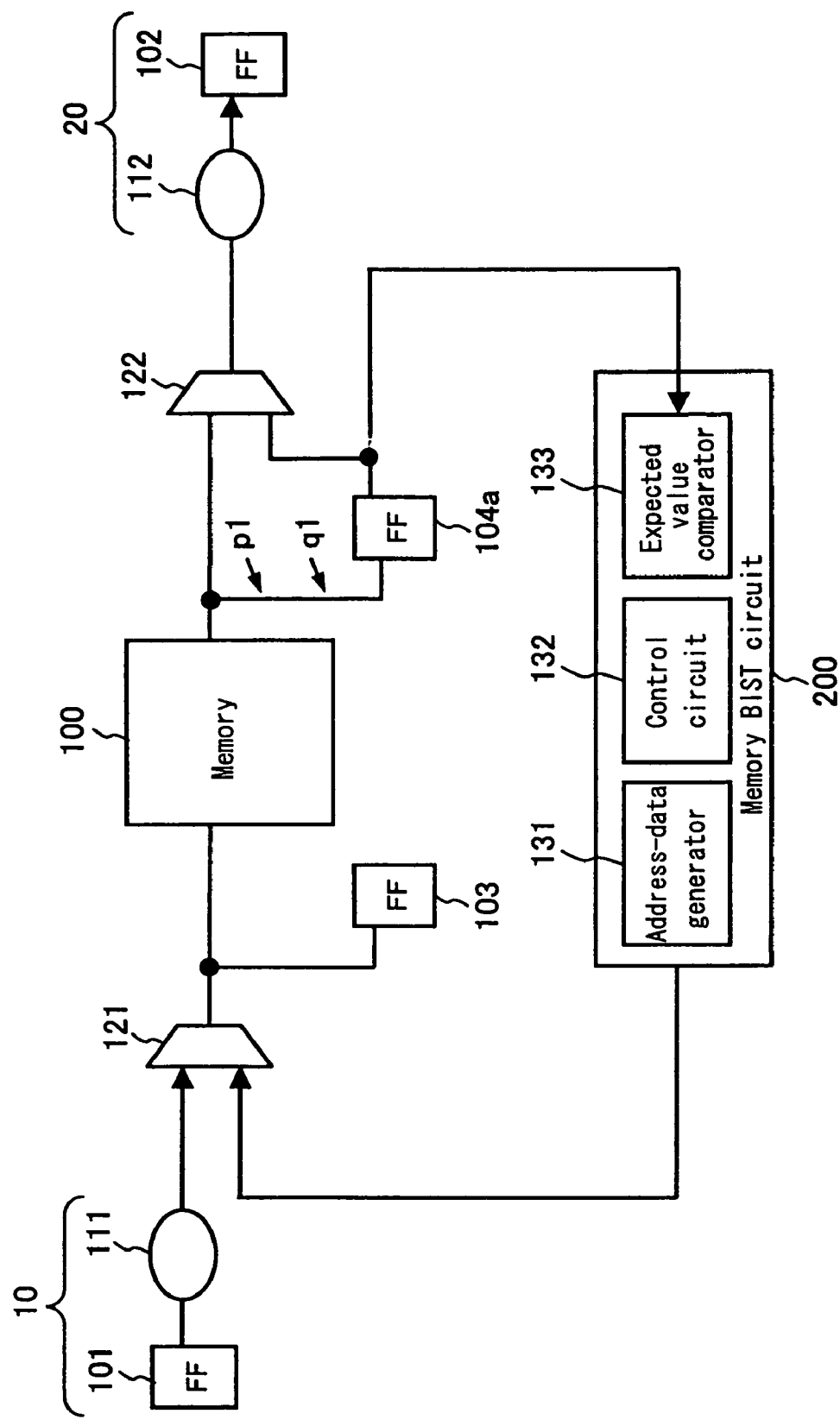
FIG. 2 is a block diagram that shows a structure of a semiconductor device in accordance with embodiment 2 of the present invention.

Embodiment 2 of the present invention, which relates to the arrangement of embodiment 1, is designed so that, as shown in FIG. 2, in place of the connection of the output of the second selection circuit 122 to the input of the memory BIST circuit 200, the output of the control/pipeline shared-use flip-flop 104a is connected to the input of the memory BIST circuit 200. The present embodiment also makes it possible to provide the same effects as embodiment 1.

Embodiment 3

Figure 3:
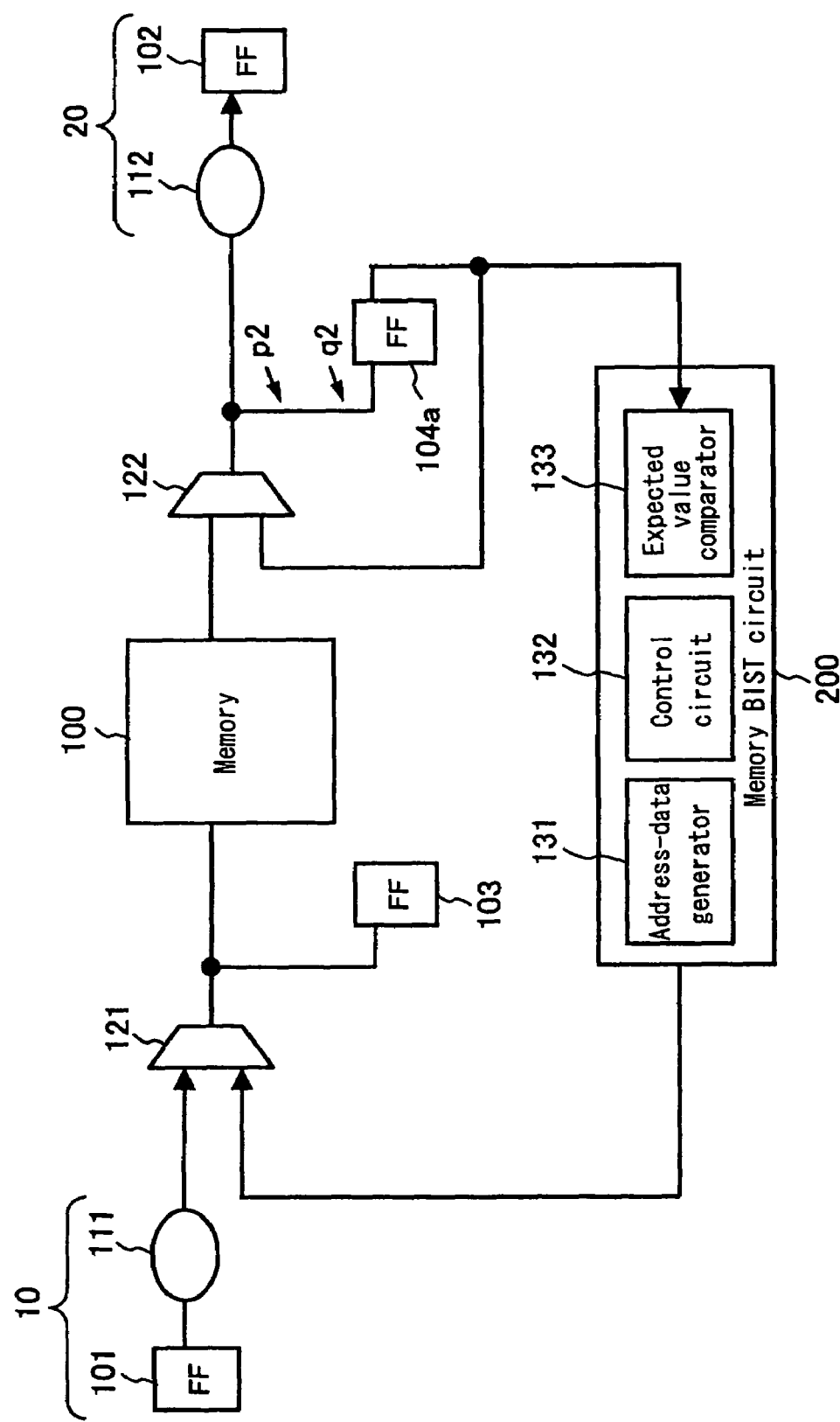
FIG. 3 is a block diagram that shows a structure of a semiconductor device in accordance with embodiment 3 of the present invention.

Embodiment 3 of the present invention, which relates to the arrangement of embodiment 1, is designed so that, as shown in FIG. 3, in place of the connection of the output of the memory 100 to the input of the control/pipeline shared-use flip-flop 104a, the output of the second selection circuit 122 is connected to the input of the control/pipeline shared-use flip-flop 104a, while, in place of the connection of the output of the second selection circuit 122 to the input of the memory BIST circuit 200, the output of the control/pipeline shared-use flip-flop 104a is connected to the input of the memory BIST circuit 200. Here, with respect to the control of the second selection circuit 122, the output of the memory 100 is selected at the time of the memory BIST process. The present embodiment also makes it possible to provide the same effects as embodiment 1.

Embodiment 4

Embodiment 4 of the present invention, which relates to a comparative example shown in FIG. 19, corresponds to the arrangement thereof from which the observing-use flip-flop 0103 is omitted, with its functions being incorporated into the pipeline-use flip-flop 0106.

Figure 4:
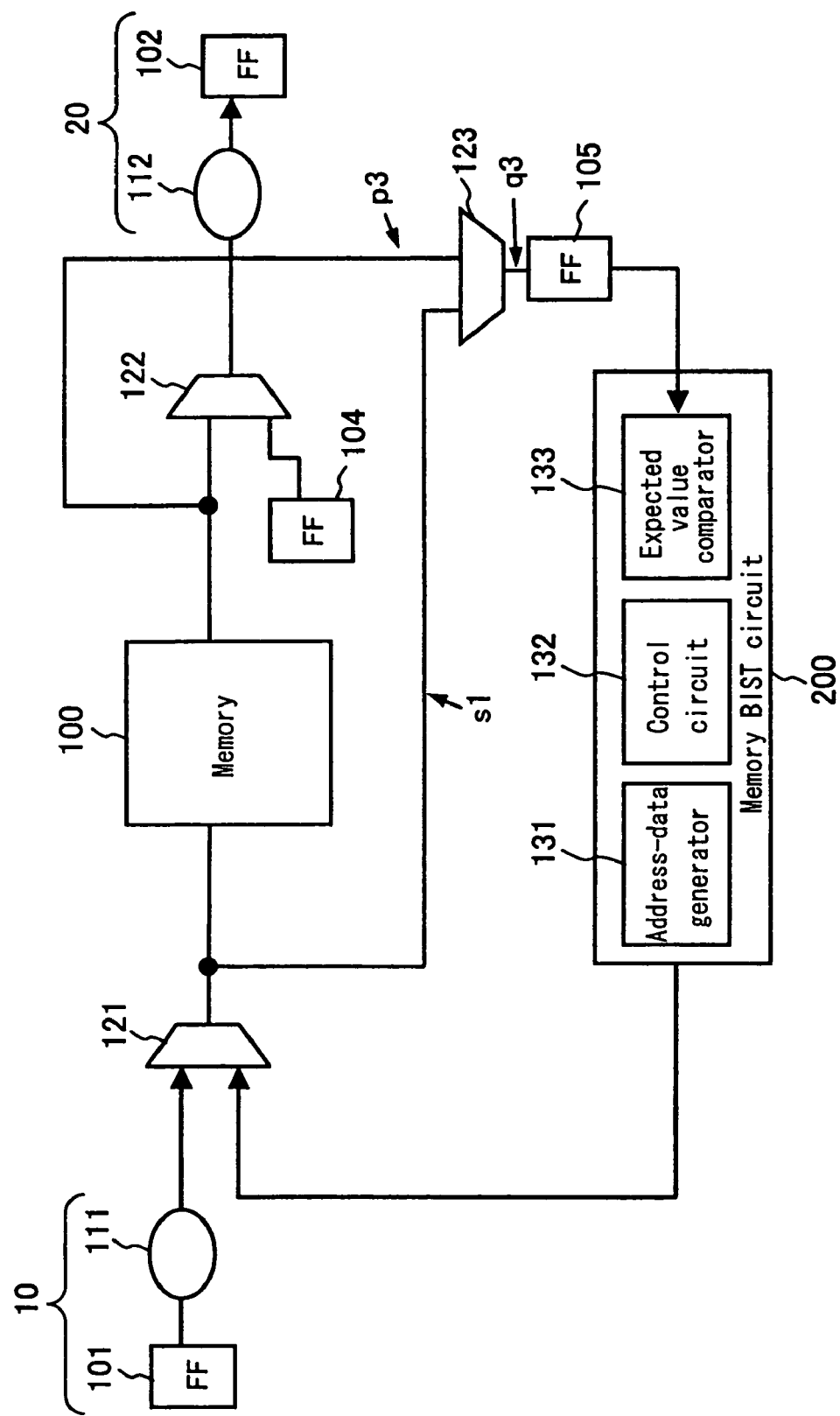
FIG. 4 is a block diagram that shows a structure of a semiconductor device in accordance with embodiment 4 of the present invention.

FIG. 4 shows a structure of a semiconductor device in accordance with embodiment 4 of the present invention. In FIG. 4, those reference numerals that are the same as those of FIG. 1 of embodiment 1 indicate the same elements; therefore, the detailed explanation thereof is omitted. Those points different from the arrangements of FIG. 1 are that the second selection circuit 122 is not connected to the memory BIST circuit 200, that a third selection circuit 123 which selects either the output of the first selection circuit 121 or the output of the memory 100 is installed, and that an observing/pipeline shared-use flip-flop 105 is placed in the output of the third selection circuit 123, with the output of the observing/pipeline shared-use flip-flop 105 being connected to the input of the memory BIST circuit 200. In other words, the observing-use flip-flop 103 of FIG. 1 is incorporated into the observing/pipeline shared-use flip-flop 105. The third selection circuit 123 is added so as to allow this incorporation.

With respect to the semiconductor device of the present embodiment having the above-mentioned arrangement, the following description discusses the operation thereof.

Here, normal operations are carried out in the same manner as those of embodiment 1.

At the time of a memory BIST process, the first selection circuit 121 selects the path from the memory BIST circuit 200. Moreover, data, outputted from the memory 100, is selected by the third selection circuit 123, and sent to the memory BIST circuit 200 after having been subjected to a pipelining process by the observing/pipeline shared-use flip-flop 105.

At the time of a scanning test, the second selection circuit 122 selects the output of the control-use flip-flop 104 so that a scanning-use test pattern is supplied to the combination circuit 112 on the output side of the normal operation path 20 on the output side, having the flip-flop 102 on the output side as its terminal. Moreover, by controlling the control inputs of the first selection circuit 121 and the third selection circuit 123 using the scanning-use test pattern, failures in the combination circuit 111 and the memory BIST circuit 200 on the input side are observed by the observing/pipeline shared-use flip-flop 105. Furthermore, the observing/pipeline shared-use flip-flop 105 supplies a scanning-use test pattern to the memory BIST circuit 200.

As described above, in accordance with the present embodiment, the flip-flop 105 is formed into an observing/pipeline shared-use flip-flop to which a pipeline-use flip-flop for use in a memory BIST process and an observing-use flip-flop for use in a scanning test are both incorporated. Consequently, in comparison with a case in which the two flip-flops having these two functions are installed independently, the number of the flip-flops can be reduced by half, making it possible to reduce the area required for the device.

Moreover, even in the case when the combination circuit 112 on the output side is complex as compared to embodiment 1, the control-use flip-flop 104 can be exclusively controlled at the time of a scanning test so that the number of the test patterns is reduced in comparison with embodiment 1.

Embodiment 5

Embodiment 5 of the present invention, which relates to the arrangement of embodiment 4, is designed so that, in place of the connection of the output of the memory 100 to the input of the third selection circuit 12, as shown in FIG. 5, the output of the second selection circuit 122 is connected to the input of the third selection circuit 123. Here, with respect to the control of the second selection circuit 122, the output of the memory 100 is selected at the time of the memory BIST process. The present embodiment also makes it possible to provide the same effects as embodiment 4.

Embodiment 6

Embodiment 6 of the present invention, which relates to a comparative example shown in FIG. 19, corresponds to the arrangement thereof from which the observing-use flip-flop 0103 and the pipeline-use flip-flop 0106 are omitted, with the functions thereof being incorporated into the control-use flip-flop 0104.

Figure 6:
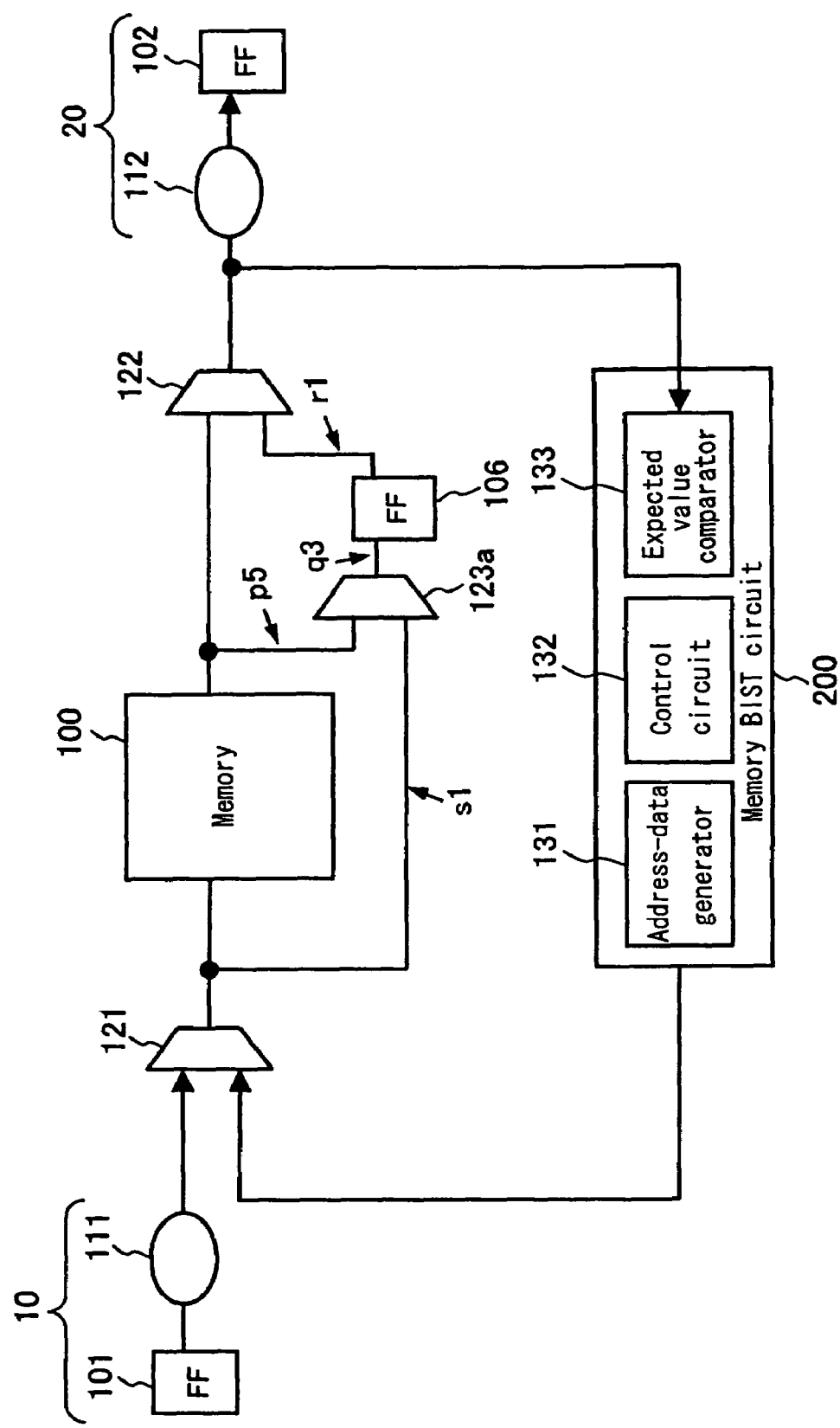
FIG. 6 is a block diagram that shows a structure of a semiconductor device in accordance with embodiment 6 of the present invention.

FIG. 6 shows a structure of a semiconductor device in accordance with embodiment 6 of the present invention. In FIG. 6, those reference numerals that are the same as those of FIG. 1 of embodiment 1 indicate the same elements; therefore, the detailed explanation thereof is omitted. Those points different from the arrangements of FIG. 1 are that the third selection circuit 123a, which selects either the output of the first selection circuit 121 or the output of the memory 100, is attached to the input of the control/observing/pipeline shared-use flip-flop 106. In other words, the observing-use flip-flop 103 of FIG. 1 and the control-use flip-flop 104a are incorporated into the control/observing/pipeline shared-use flip-flop 106. The third selection circuit 123a is added so as to allow this incorporation.

With respect to the semiconductor device of the present embodiment having the above-mentioned arrangement, the following description discusses operations thereof.

First, normal operations are carried out in the same manner as those of embodiment 1.

At the time of a memory BIST process, the first selection circuit 121 selects the path from the memory BIST circuit 200. Moreover, data, outputted from the memory 100, is selected by the third selection circuit 123a, and after having been subjected to a pipelining process by the control/observing/pipeline shared-use flip-flop 106, is further selected by the second selection circuit 122, and then sent to the memory BIST circuit 200.

At the time of a scanning test, the second selection circuit 122 selects the control/observing/pipeline shared-use flip-flop 106 so that a scanning-use test pattern is supplied to the combination circuit 112 on the output side of the normal operation path 20 on the output side having the flip-flop 102 on the output side as its terminal and the memory BIST circuit 200. Moreover, by controlling the control inputs of the first selection circuit 121 and the third selection circuit 123a using the scanning-use test pattern, failures in the combination circuit 111 and the memory BIST circuit 200 on the input side are observed by the control/observing/pipeline shared-use flip-flop 106.

As described above, in accordance with the present embodiment, the flip-flop 106 is formed into a control/observing/pipeline shared-use flip-flop to which a pipeline-use flip-flop for use in a memory BIST process, an observing-use flip-flop for use in a scanning test and a control-use flip-flop for use in a scanning test are all incorporated. Consequently, in comparison with a case in which the three flip-flops having these three functions are installed independently, the number of the flip-flops can be reduced by one third, making it possible to greatly reduce the required area for the device.

Embodiment 7

Figure 7:
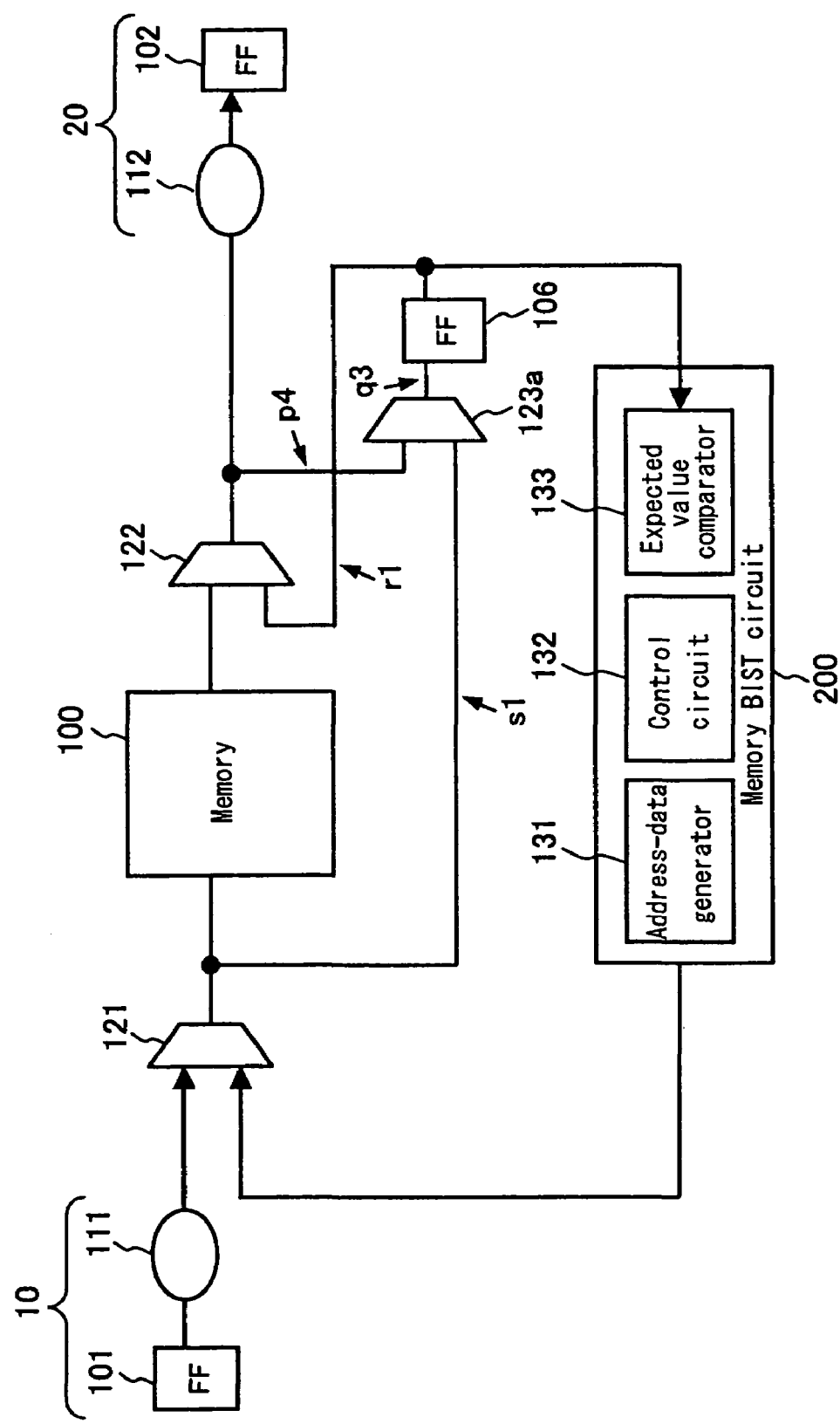
FIG. 7 is a block diagram that shows a structure of a semiconductor device in accordance with embodiment 7 of the present invention.

Embodiment 7 of the present invention, which relates to the arrangement of embodiment 6, is designed so that, in place of the connection of the output of the second selection circuit 122 to the input of the memory BIST circuit 200, as shown in FIG. 7, the output of the second selection circuit 122 is connected to the input of the third selection circuit 123a, while, in place of the connection of the output of the second selection circuit 122 to the input of the memory BIST circuit 200, the output of the control/observing/pipeline shared-use flip-flop 106 is connected to the input of the memory BIST circuit 200. Here, with respect to the control of the second selection circuit 122, the output of the memory 100 is selected at the time of the memory BIST process. The present embodiment also makes it possible to provide the same effects as embodiment 6.

Embodiment 8

Embodiment 8 of the present invention, which relates to the arrangement of embodiment 6, is designed so that the expected value comparator in the memory BIST circuit is placed on the output side of the memory.

Figure 8:
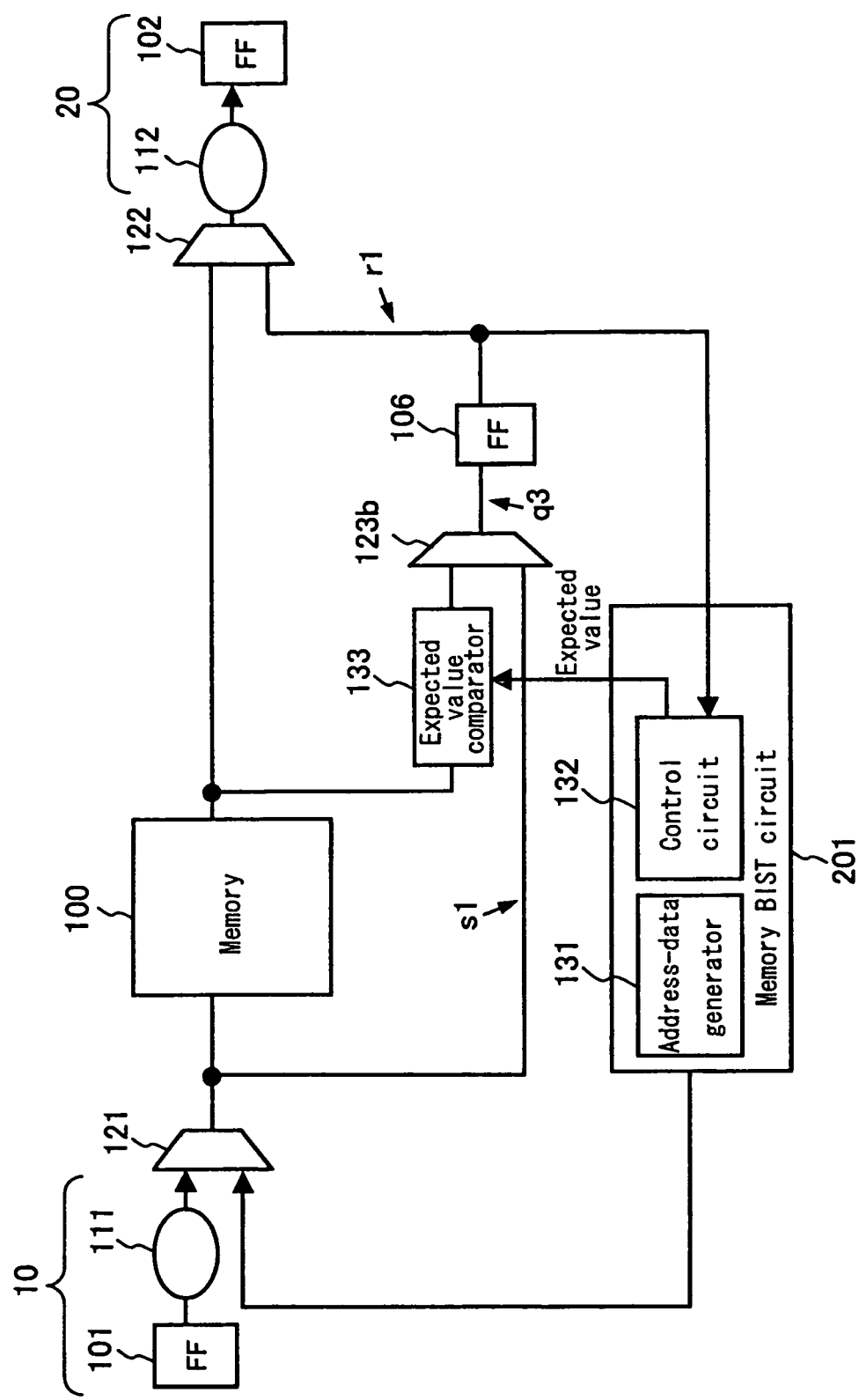
FIG. 8 is a block diagram that shows a structure of a semiconductor device in accordance with embodiment 8 of the present invention.

FIG. 8 shows a structure of a semiconductor device in accordance with embodiment 8 of the present invention. In FIG. 8, those reference numerals that are the same as those of FIG. 6 of embodiment 6 indicate the same constituent elements; therefore, the detailed explanation thereof is omitted. The arrangement of the present embodiment is different from that of FIG. 6 in that an expected value comparator 133 is installed between the output of the memory 100 and the third selection circuit 123b (see p5 of FIG. 6). The memory BIST circuit 201 comprises an address-data generator 131 and a control circuit 132, and the expected value comparator 133 is placed outside the memory BIST circuit 201, and with respect to the memory BIST functions, the address-data generator 131, the control circuit 132 and the expected value comparator 133 are integrated into one functional unit.

With respect to the semiconductor device of the present embodiment having the above-mentioned arrangement, the following description discusses the operation thereof.

Here, normal operations are carried out in the same manner as those of embodiment 6.

At the time of a memory BIST process, the first selection circuit 121 selects the path from the memory BIST circuit 201. Moreover, data, outputted from the memory 100, is allowed to pass through the expected value comparator 133 and the third selection circuit 123b, and after having been formed into a pipeline format by the control/observing/pipeline shared-use flip-flop 106, is sent to the control circuit 132 of the memory BIST circuit 201.

As described above, in accordance with the present embodiment, prior to the pipelining process in the control/observing/pipeline shared-use flip-flop 106 at the time of the memory BIST process, the data is subjected to the expected value comparing process. With this arrangement, in the path from the control/observing/pipeline shared-use flip-flop 106 to the flip-flop in the control circuit 132 within the memory BIST circuit 201, a timing margin corresponding to a delay of the expected value comparator 133 is prepared, as compared to the arrangement of embodiment 6. In particular, even in the case of a memory BIST circuit having a great delay inside thereof, a testing operation can be effectively carried out by using an actual operation frequency.

Figure 9:
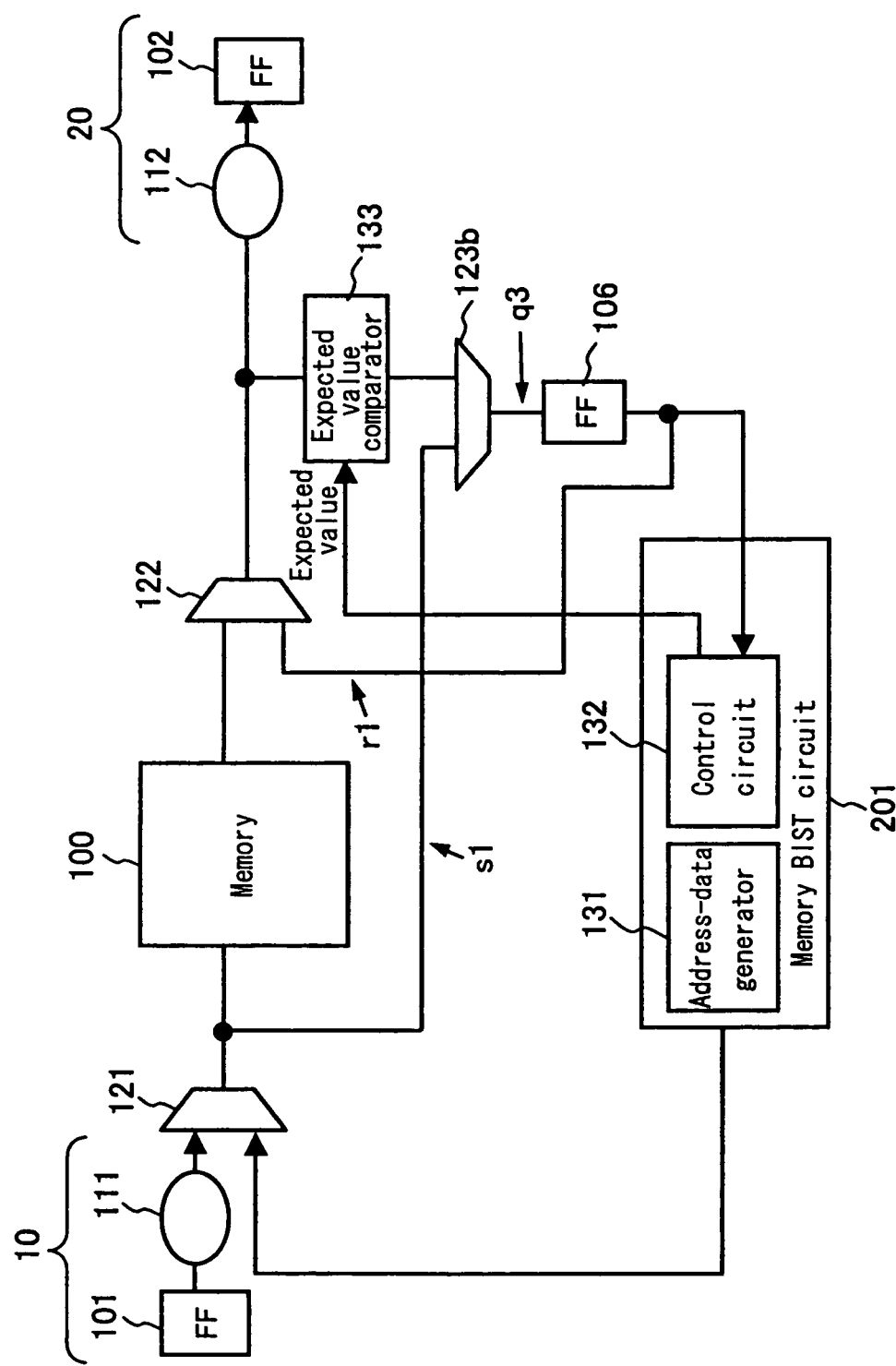
FIG. 9 is a block diagram that shows a structure of a semiconductor device in a modified mode of embodiment 8 of the present invention.

Here, in embodiment 8, in place of the connection of the output of the memory 100 to the input of the expected value comparator 133, as shown in FIG. 9, the output of the second selection circuit 122 maybe connected to the input of the expected value comparator 133. Here, with respect to the control of the second selection circuit 122, the output of the memory 100 is selected at the time of the memory BIST process.

The technical idea of the present embodiment may be applied to the arrangements shown in FIGS. 1 to 5 and FIG. 7, and this is achieved by simply inserting the expected value comparator to portions of p1 to p4 in the Figures, with the same effects as described above.

Embodiment 9

Embodiment 9 of the present invention, which has the same arrangement as embodiment 4 with a control-use 104 of an independent type, is designed so that the expected value comparator in the memory BIST circuit is placed on the output side of the memory in the same manner as embodiment 8. The flip-flop to be sharedly used forms an observing/pipeline shared-use flip-flop.

Figure 10:
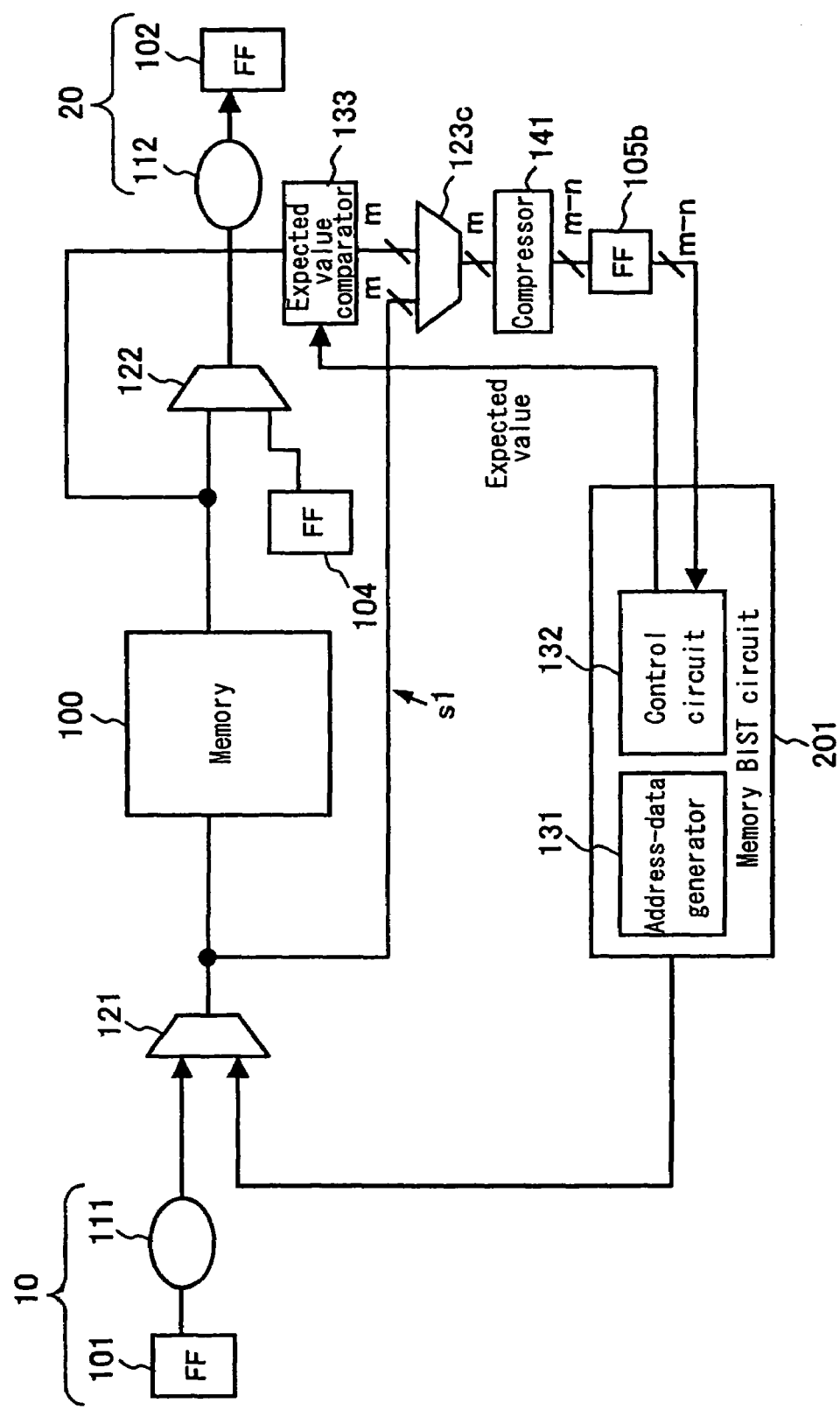
FIG. 10 is a block diagram that shows a structure of a semiconductor device in accordance with embodiment 9 of the present invention.

FIG. 10 shows a structure of a semiconductor device in accordance with embodiment 9 of the present invention. In FIG. 10, those reference numerals that are the same as those of FIG. 4 of embodiment 4 indicate the same elements; therefore, the detailed explanation thereof is omitted. The arrangement of the present embodiment is different from that of FIG. 4 in that an expected value comparator 133 is installed between the output of the memory 100 and a third selection circuit 123c, and in that a compressor 141 is installed between the third selection circuit 123c and an observing/pipeline shared-use flip-flop 105b. This compressor 141 is designed so that, in the case of an expected value comparator that outputs "High" in response to no expected value error, the logical product of the respective bits of the comparator outputs is found so as to compress the results.

With respect to the semiconductor device of the present embodiment having the above-mentioned arrangement, the following description discusses the operation thereof.

Here, with respect to the operation at the time of a normal process and at the time of a scanning test, the same operations as embodiment 4 are carried out.

At the time of a memory BIST process, the first selection circuit 121 selects the path from the memory BIST circuit 201. Moreover, data, outputted from the memory 100, is allowed to pass through the expected value comparator 133 and the third selection circuit 123c and also to pass through the compressor 141 so that the number of bits of the bus is reduced, and after having been formed into a pipeline format by the observing/pipeline shared-use flip-flop 105b, is sent to the memory BIST circuit 201.

As described above, in accordance with the present embodiment, it is possible to cut the number of bits of the bus by using the compressor 141, and consequently to cut the number of the observing/pipeline shared-use flip-flops 105b, as compared to embodiment 4.

Figure 11:
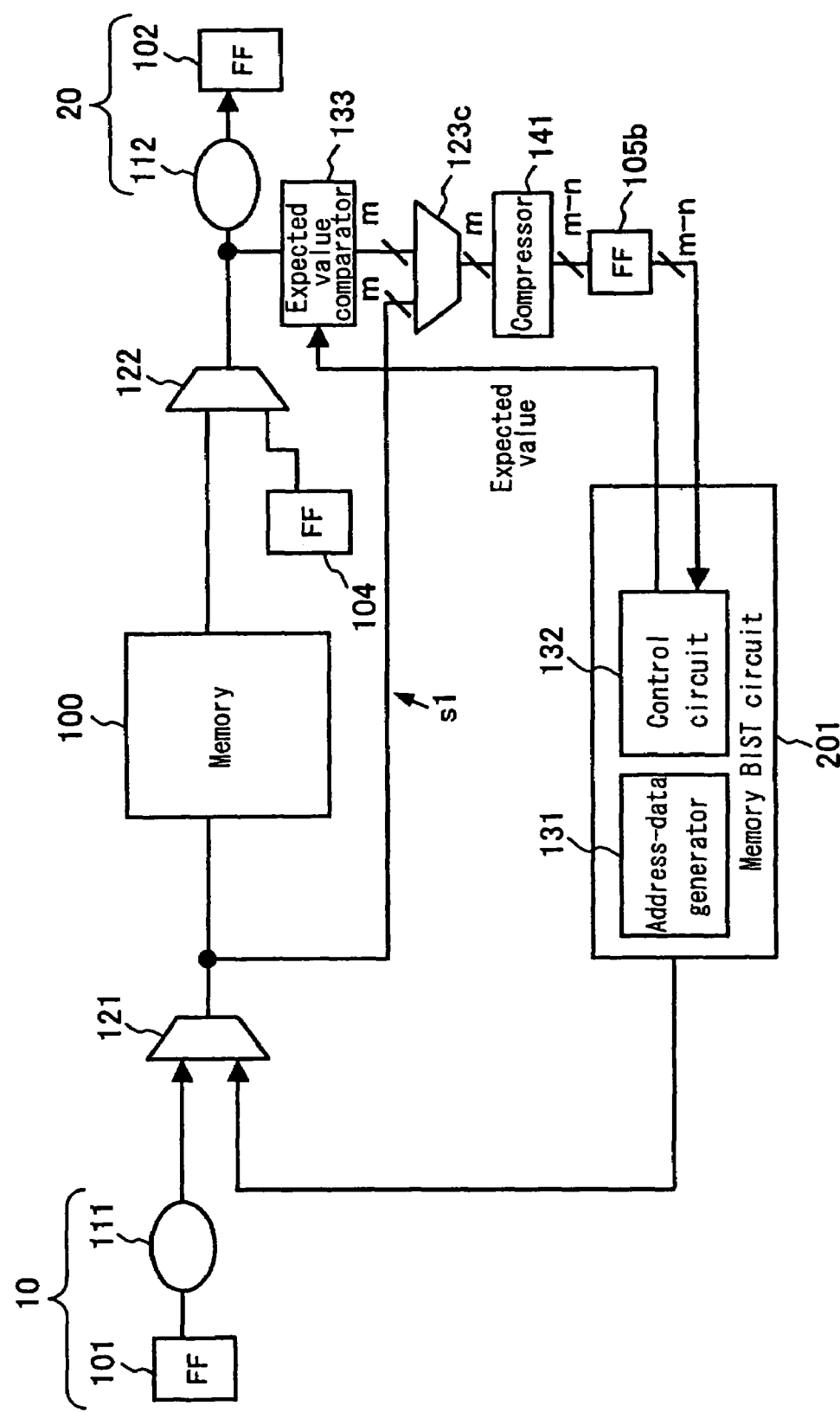
FIG. 11 is a block diagram that shows a structure of a semiconductor device in a modified mode of embodiment 9 of the present invention.

In embodiment 9, in place of the connection of the output of the memory 100 to the input of the expected value comparator 133, as shown in FIG. 11, the output of the second selection circuit 122 may be connected to the input of the expected value comparator 133. Here, with respect to the control of the second selection circuit 122, the output of the memory 100 is selected at the time of the memory BIST process.

The technical idea of the present embodiment maybe applied to the arrangements shown in FIGS. 1 to 9, and this is achieved by simply inserting the compressor to portions of q1 to q3 in the Figures, with the same effects as described above.

Embodiment 10

Embodiment 10 of the present invention has an arrangement in which the solution of embodiment 9 is applied to the arrangement of embodiment 8 having a flip-flop that is utilized for the three functions.

FIG. 12 shows a structure of a semiconductor device in accordance with embodiment 10 of the present invention. In FIG. 6, those reference numerals that are the same as those of FIG. 8 of embodiment 8 indicate the same constituent elements; therefore, the detailed explanation thereof is omitted. The arrangement of the present embodiment is different from that of FIG. 8 in that the same compressor 141 as embodiment 9 is installed between the third selection circuit 123c and the control/observing/pipeline shared-use flip-flop 106a, and in that an expansion device 151 is installed between the control/observing/pipeline shared-use flip-flop 106a and the second selection circuit 122. Here, this expansion device 151 may have, for example, an arrangement in which input bits are simply connected to a plurality of output bits.

With respect to the semiconductor device of the present embodiment having the above-mentioned arrangement, the following description discusses the operation thereof.

Here, normal operations are carried out in the same manner as those of embodiment 8.

At the time of a memory BIST process, the first selection circuit 121 selects the path from the memory BIST circuit 201. Moreover, data, outputted from the memory 100, is allowed to pass through the expected value comparator 133 and the third selection circuit 123c and also to pass through the compressor 141 so that the number of bits of the bus is reduced, and after having been subjected to a pipelining process by the control/observing/pipeline shared-use flip-flop 106, is sent to the memory BIST circuit 201.

At the time of a scanning test, the second selection circuit 122 selects an output obtained by expanding the output of the control/observing/pipeline shared-use flip-flop 106a using the expansion device 151 so that the combination circuit 112, located on the output side of the normal operation path 20 on the output side having the flip-flop 102 on the output side as its terminal, is controlled. Moreover, the control inputs of the first selection circuit 121 and the third selection circuit 123c are controlled by a scanning-use test pattern so that failures in the combination circuit 111 and the memory BIST circuit 201 on the input side are observed in the control/observing/pipeline shared-use flip-flop 106a.

As described above, the present embodiment makes it possible to reduce the number of the control-use flip-flops 104, as compared to embodiment 9.

Figure 13:
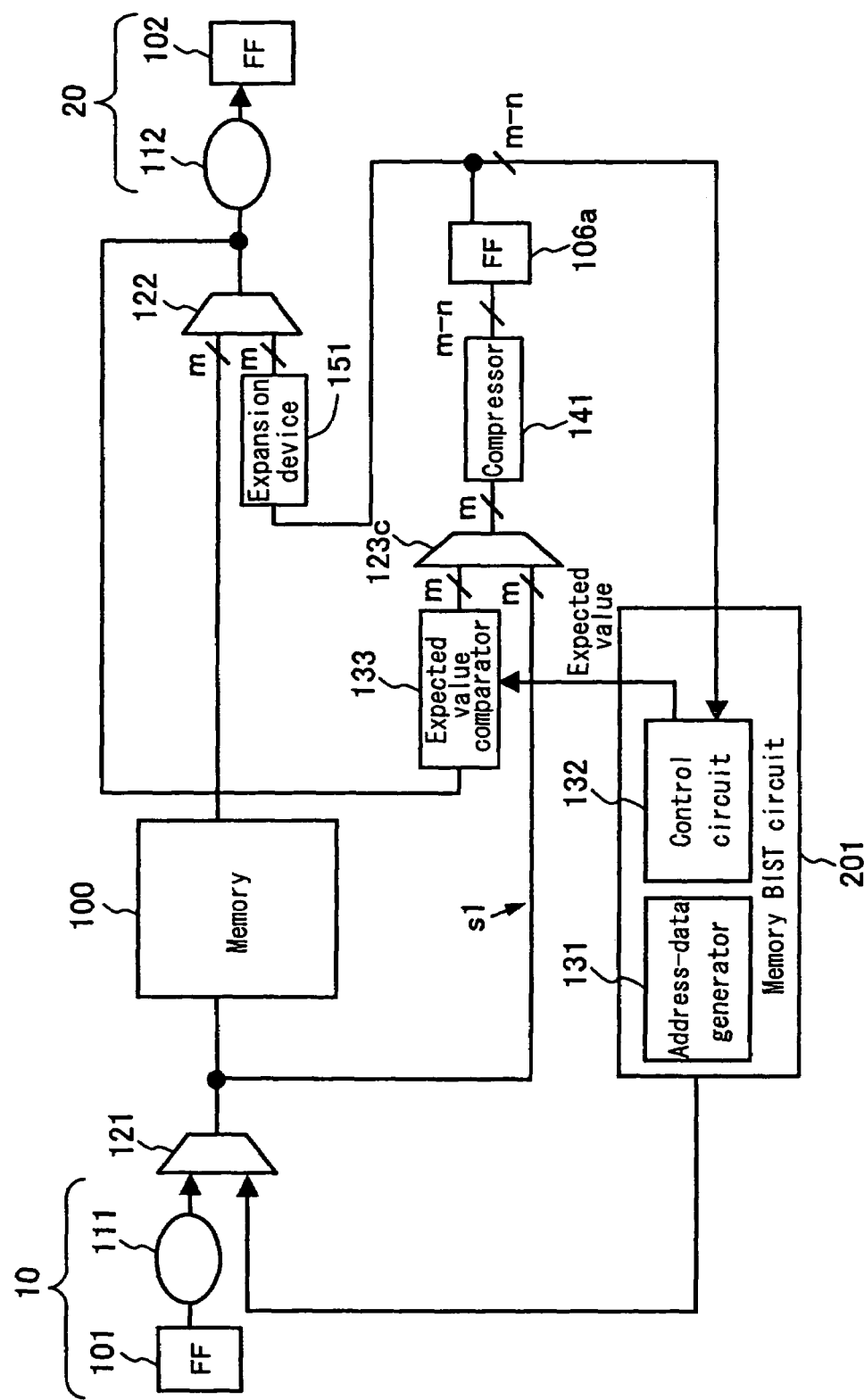
FIG. 13 is a block diagram that shows a structure of a semiconductor device in a modified mode of embodiment 10 of the present invention.

Here, in embodiment 10, in place of the connection of the output of the memory 100 to the input of the expected value comparator 133, as shown in FIG. 13, the output of the second selection circuit 122 maybe connected to the input of the expected value comparator 133. Here, with respect to the control of the second selection circuit 122, the output of the memory 100 is selected at the time of the memory BIST process.

The technical idea of the present embodiment may be applied to the arrangements shown in FIGS. 6 to 9, and this is achieved by simply inserting the expansion device to a portion r1 in the Figures, with the same effects as described above.

Embodiment 11

Embodiment 11 of the present invention has an arrangement in which the solution of embodiment 9 is applied to the arrangement of embodiment 12 having a flip-flop that is utilized for the three functions, in a mode different from that of embodiment 10.

Figure 14:
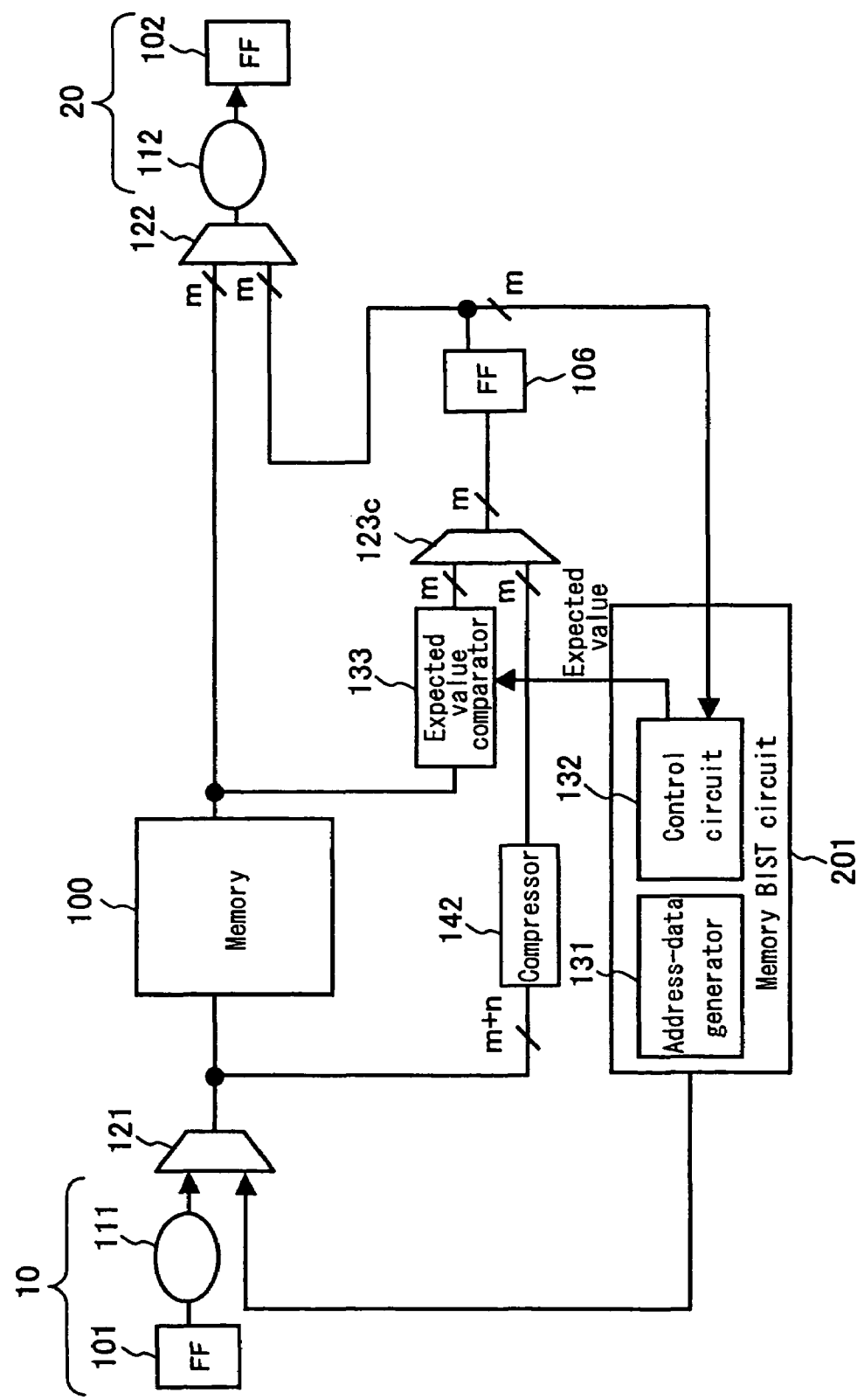
FIG. 14 is a block diagram that shows a structure of a semiconductor device in accordance with embodiment 11 of the present invention.

FIG. 14 shows a structure of a semiconductor device in accordance with embodiment 10 of the present invention. In FIG. 14, those reference numerals that are the same as those of FIG. 8 of embodiment 8 indicate the same elements; therefore, the detailed explanation thereof is omitted. The arrangement of the present embodiment is different from that of FIG. 8 in that a compressor 142 is installed between the first selection circuit 121 and the third selection circuit 123c. Here, this compressor 142 comprises, for example, XOR gates that can easily generate a scanning-use test pattern. In this case, different from embodiment 10, no expansion device 151 is installed.

With respect to the semiconductor device of the present embodiment having the above-mentioned arrangement, the following description discusses the operation thereof.

Here, at the time of a memory BIST process upon normal operation, operations are carried out in the same manner as embodiment 8.

At the time of a scanning test, operations are carried out in the same manner as embodiment 8, except that data is allowed to pass through the compressor 142. The number of input pins of the memory 100 is greater than the number of output pins in association with addresses and the like. By using the compressor 142, the number of the input pins is reduced to the number of the output pins, thereby making it possible to reduce the number of the control/observing/pipeline shared-use flip-flops 106.

As described above, in accordance with the present embodiment, since the number of bits is reduced by the compressor 142, it becomes possible to reduce the number of shared-use flip-flops by the corresponding number of the bits reduced by the compressor, as compared to embodiment 8.

Here, in embodiment 11, in place of the connection of the output of the memory 100 to the input of the expected value comparator 133, as shown in FIG. 15, the output of the second selection circuit 122 may be connected to the input of the expected value comparator 133. Here, with respect to the control of the second selection circuit 122, the output of the memory 100 is selected at the time of the memory BIST process.

The technical idea of the present embodiment may be applied to the arrangements shown in FIGS. 4 to 13, and this is achieved by simply inserting the compressor to a portion s1 in the Figures, with the same effects as described above.

Embodiment 12

Embodiment 12 of the present invention has an arrangement in which the solution of embodiment 9 for the expected value comparator is applied to the arrangement of embodiment 12 having a flip-flop that is utilized for the three functions.

Figure 16:
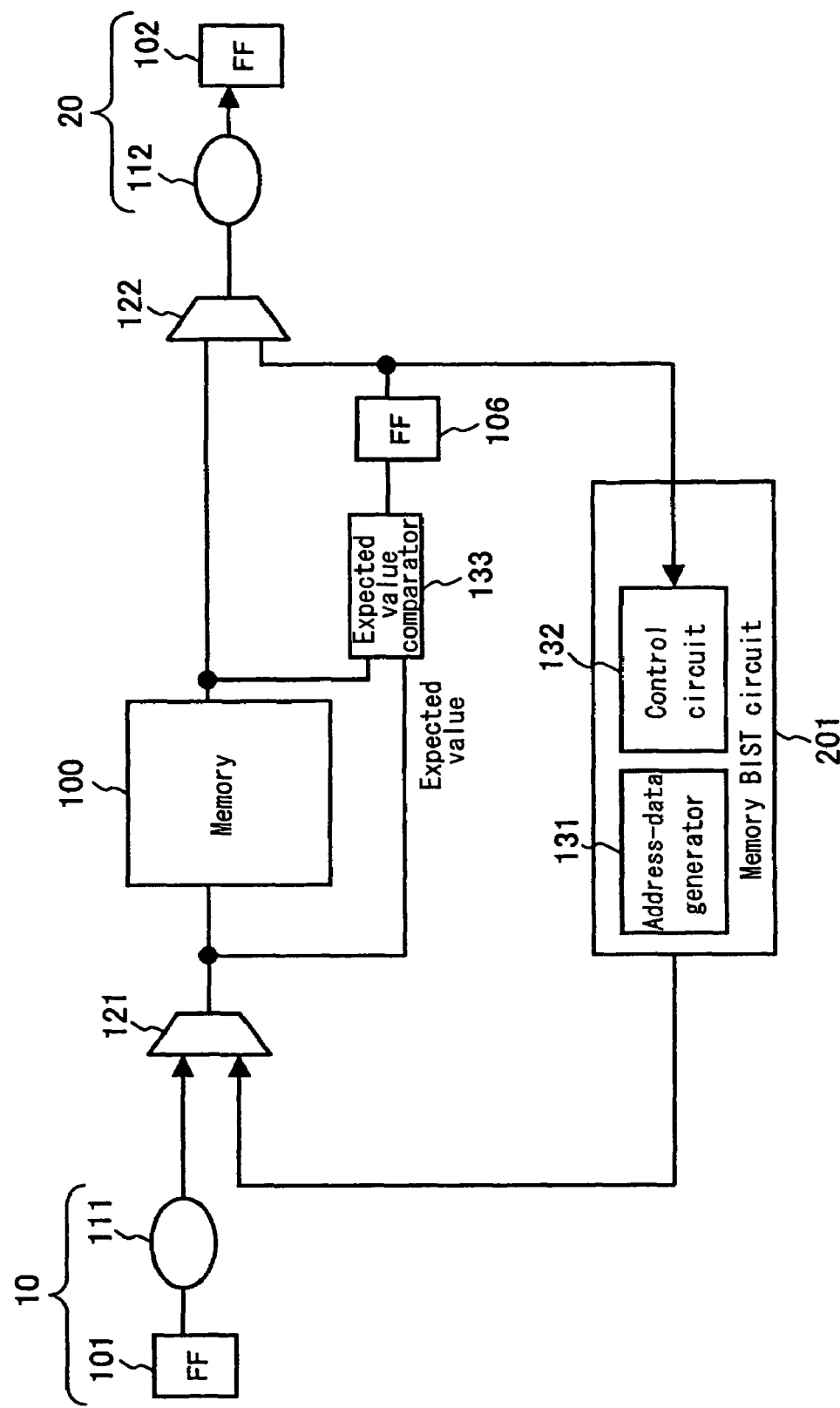
FIG. 16 is a block diagram that shows a structure of a semiconductor device in accordance with embodiment 12 of the present invention.

FIG. 16 shows a structure of a semiconductor device in accordance with embodiment 12 of the present invention. In FIG. 16, those reference numerals that are the same as those of FIG. 8 of embodiment 8 indicate the same elements; therefore, the detailed explanation thereof is omitted. The arrangement of the present embodiment is different from that of FIG. 8 in the input path of expected values to the expected value comparator 133. The expected values are inputted not from the memory BIST circuit 201, but from the data transfer path from the memory BIST circuit 201 to the memory 100 to be used at the time of a memory BIST process, that is, the path that passes through the first selection circuit 121. In the case of a normal memory such as a 1-port SRAM, since reading and writing processes are not carried out simultaneously, the data input at the time of reading can be utilized as the expected value. The third selection circuit 123b of FIG. 8 is not installed.

With respect to the semiconductor device of the present embodiment having the above-mentioned arrangement, the following description discusses the operation thereof.

Here, normal operations are carried out in the same manner as embodiment 8.

At the time of a memory BIST process, the first selection circuit 121 selects the path from the memory BIST circuit 201. Moreover, output data from the memory 100 is compared in the expected value comparator 133, and after having been formed into a pipeline format by the control/observing/pipeline shared-use flip-flop 106, the resulting data is sent to the memory BIST circuit 201.

At the time of a scanning test process, the second selection circuit 122 selects the control/observing/pipeline shared-use flip-flop 106, and supplies scanning test data to the combination circuit 112 on the output side. Moreover, the control/observing/pipeline shared-use flip-flop 106 supplies scanning test data to the BIST circuit 201. Moreover, the control input to the first selection circuit 121 is made controllable by using the scanning-use test pattern, and allowed to pass through the expected value comparator 133 so as to be inputted to the control/observing/pipeline shared-use flip-flop 106 in which failures in the combination circuit 111 and the memory BIST circuit 201 are observed. In this case, the output value of the memory 100 to be inputted to the expected value comparator 133 needs to be made calculable or set to a fixed value so as to form expected value data.

As described above, in accordance with this embodiment, the number of the third selection circuits can be reduced, as compared to embodiment 8.

Figure 17:
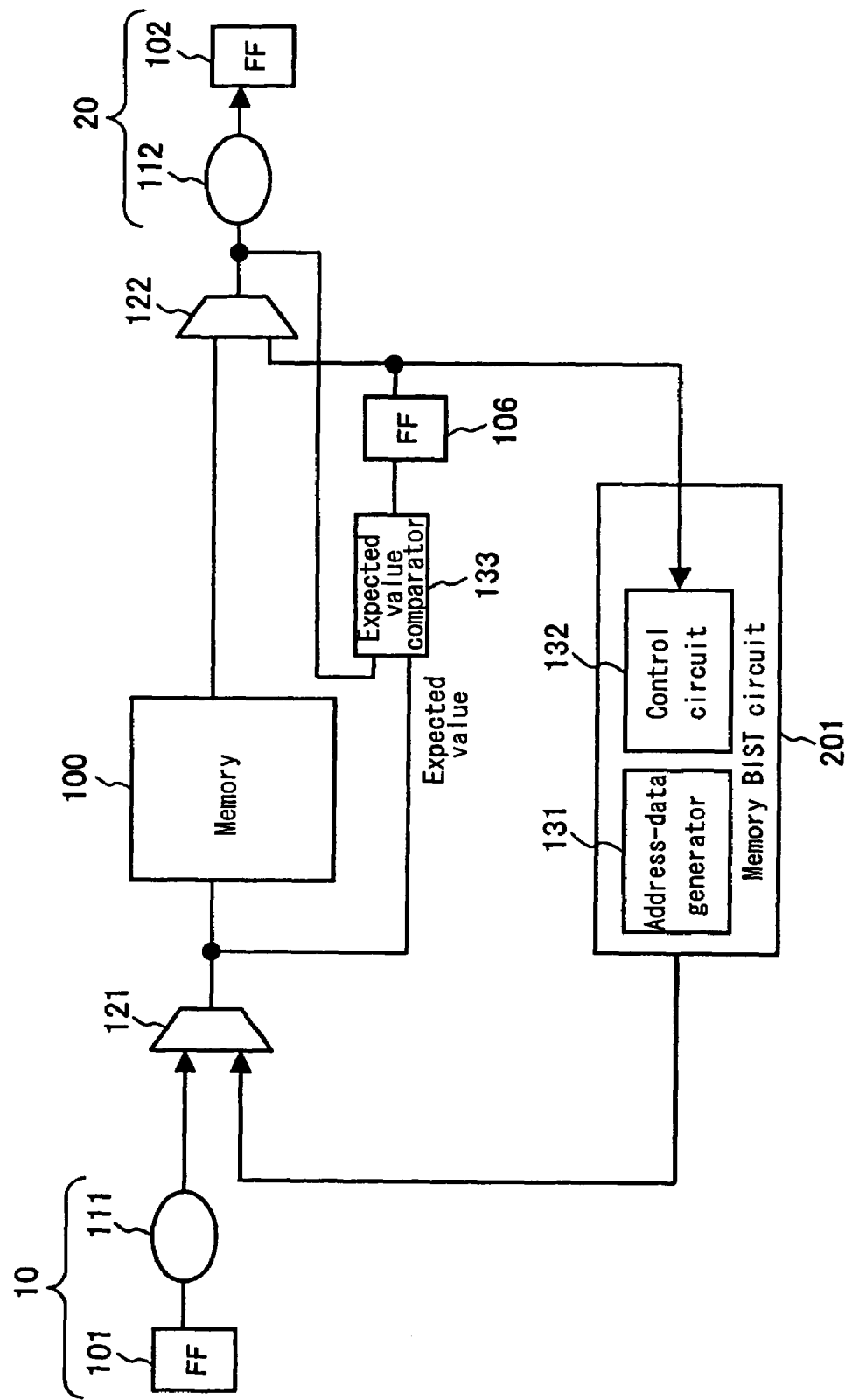
FIG. 17 is a block diagram that shows a structure of a semiconductor device in a modified mode of embodiment 12 of the present invention.

Here, in embodiment 12, in place of the connection of the output of the memory 100 to the input of the expected value comparator 133, as shown in FIG. 17, the output of the second selection circuit 122 may be connected to the input of the expected value comparator 133. Here, with respect to the control of the second selection circuit 122, the output of the memory 100 is selected at the time of the memory BIST process.

Embodiment 13

Embodiment 13 of the present invention corresponds to the arrangement of embodiment 8 having a flip-flop that is utilized for the three functions, in which the memory 100 and the second selection circuit 122 are disconnected, with the two parts being connected through the expected value comparator 133.

Figure 18:
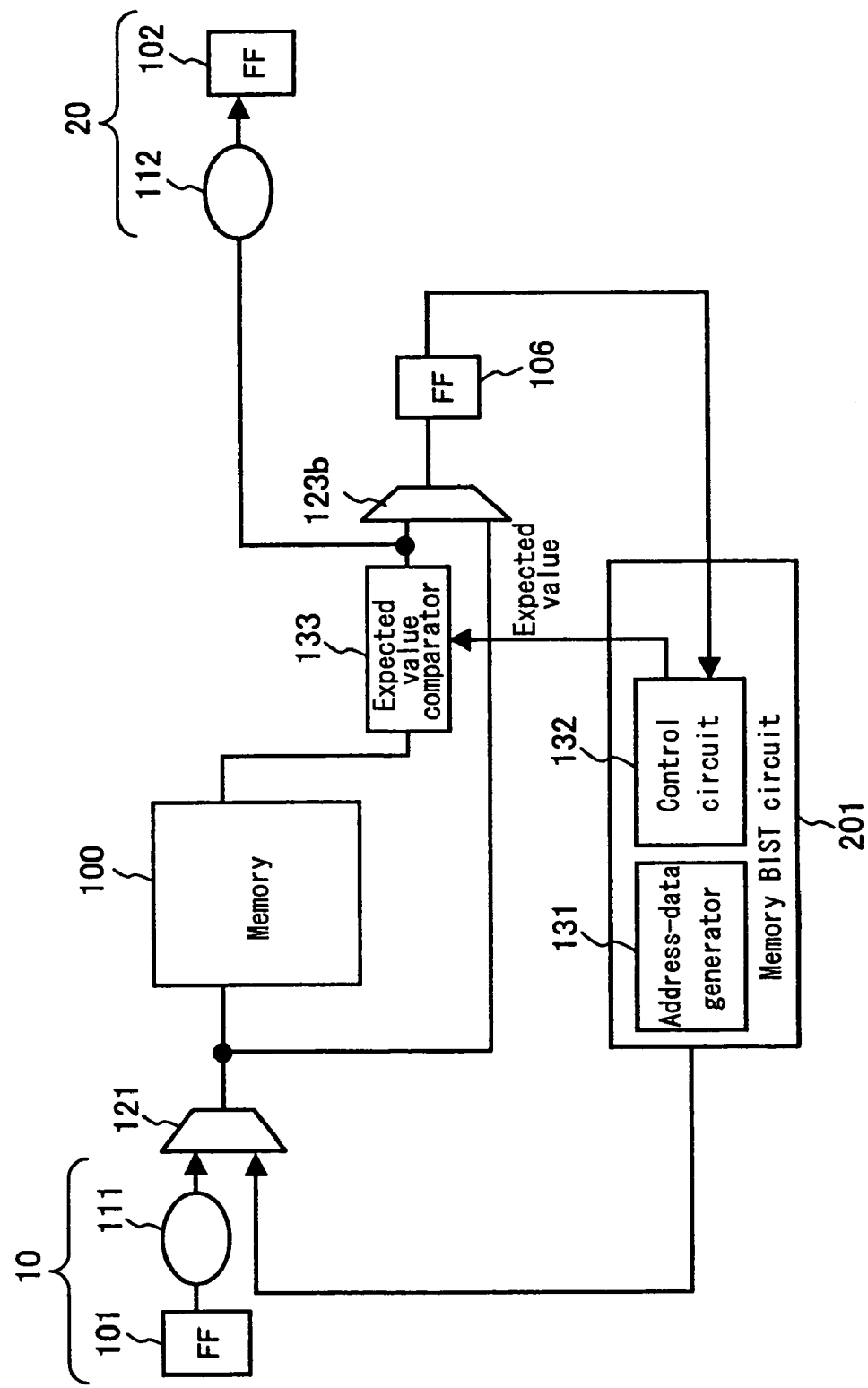
FIG. 18 is a block diagram that shows a structure of a semiconductor device in accordance with embodiment 13 of the present invention.

FIG. 18 shows a structure of a semiconductor device in accordance with embodiment 13 of the present invention. In FIG. 18, those reference numerals that are the same as those of FIG. 8 of embodiment 8 indicate the same constituent elements; therefore, the detailed explanation thereof is omitted. The arrangement of FIG. 18 is different from that of FIG. 8 in that, at the time of a normal operation, the normal operation path 20 on the output side to the flip-flop 102 on the output side from the output of the memory 100 is always allowed to pass through the expected value comparator 133. Here, at this time, the expectation value outputted from the memory BIST circuit 201 needs to be fixed. The second selection circuit 122 is not installed.

With respect to the semiconductor device of the present embodiment having the above-mentioned arrangement, the following description discusses the operation thereof.

Here, at the time of a normal operation, the first selection circuit 121 selects the normal operation path 10 on the input side having the flip-flop 101 on the input side in its starting point. Moreover, the normal operation path 20 on the output side from the output of the memory 100 to the flip-flop 102 on the output side is allowed to always pass through the expected value comparator 133.

Here, at the time of a memory BIST process, operations are carried out in the same manner as embodiment 12.

At the time of a scanning test, the expected value to be inputted from the memory BIST circuit 201 to the expected value comparator 133 can be controlled by the flip-flop in the memory BIST circuit 201; therefore, the scanning-use test pattern is supplied to the combination circuit 112 on the output side. Here, the output value of the memory 100 to be inputted to the expected value comparator 133 needs to be calculable or set to a fixed value so as to form expected value data. Moreover, the control input to the first selection circuit 121 is controlled by using the scanning-use test pattern so that failures in the combination circuit 111 and the memory BIST circuit 201 are observed in the control/observing/pipeline shared-use flip-flop 106.

As described above, the present embodiment makes it possible to reduce the number of selection circuits as compared to embodiment 8.

In accordance with the present invention, a single flip-flop is utilized as a control/pipeline shared-use flip-flop, or as an observing/pipeline shard-use flip-flop, or as a control/pipeline/pipeline shared-use flip-flop. As a result, in comparison with a case in which flip-flops having the respective functions are installed independently, it is possible to reduce the number of flip-flops and also to reduce the required area for the device.

From the above description, it will be apparent that the present invention provides.

What is claimed is:

1. A semiconductor device, comprising:
a memory;
a normal operation path on an input side, formed by a flip-flop on an input side and a combination circuit on the input side with respect to the memory;
a normal operation path on an output side, formed by a combination circuit on an output side and a flip-flop on the output side with respect to the memory;
a memory BIST circuit with respect to the memory;
a first selection circuit which selects either the normal operation path on the input side or the input path from the memory BIST circuit, and connects the resulting path to the input of the memory;
a control-use flip-flop which supplies a scanning-use test pattern to the normal operation path on the output side at a time of a scanning test;
a second selection circuit which selects either the output of the memory or the output of the control-use flip-flop, and connects the resulting output to the normal operation path on the output side and the input of the memory BIST circuit; and
a third selection circuit which selects one of the output of the first selection circuit and the output of the memory, wherein the output of the third selection circuit is connected to the input of the control-use flip-flop so that the control-use flip-flop is formed into a control, observing and pipeline shared-use flip-flop that is also used as both an observing-use flip-flop and a pipeline-use flip-flop.

2. The semiconductor device according to claim 1, wherein in place of the connection of the output of the memory to the input of the third selection circuit, the output of the second selection circuit is connected to the input of the third selection circuit, while, in place of the connection of the output of the second selection circuit to the input of the memory BIST circuit, the output of the control, observing and pipeline shared-use flip-flop that has been formed into a shared part is connected to the input of the memory BIST circuit.

3. The semiconductor device according to claim 2, wherein an expected value comparator of the memory BIST circuit is inserted between the output of the second selection circuit and the input of the third selection circuit.

4. The semiconductor device according to claim 3, wherein a compressor is placed in a path from the output of the expected value comparator to the input of the shared flip-flop.

5. The semiconductor device according to claim 1, wherein an expected value comparator of the memory BIST circuit is inserted between the output of the memory and the input of the third selection circuit.

6. The semiconductor device according to claim 5, wherein a compressor is placed in a path from the output of the expected value comparator to the input of the shared flip-flop.

7. The semiconductor device according to any one of, claim 5 and claim 3, wherein the input path of the expected value data to the expected value comparator diverges from a path for a data input to the memory through the first selection circuit.

8. The semiconductor device according to any one of claim 5 and claim 3, wherein the output of the memory is input to the normal operation path on the output side through the expected value comparator.

* * * * *